(12) United States Patent
Okawa et al.

(10) Patent No.: US 9,117,516 B2
(45) Date of Patent: Aug. 25, 2015

(54) RESISTANCE CHANGE MEMORY

(71) Applicants: KABUSHIKI KAISHA TOSHIBA, Minato-ku (JP); SanDisk Corporation, Sunnyvale, CA (US)

(72) Inventors: Takamasa Okawa, Yokkaichi (JP); Fumitoshi Ito, Yokohama (JP); Youichi Minemura, Yokkaichi (JP); Takayuki Tsukamoto, Yokkaichi (JP); Hiroshi Kanno, Yokkaichi (JP)

(73) Assignees: KABUSHIKI KAISHA TOSHIBA, Minato-ku (JP); SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 14/018,790

(22) Filed: Sep. 5, 2013

(65) Prior Publication Data

US 2014/0334221 A1    Nov. 13, 2014

Related U.S. Application Data

(60) Provisional application No. 61/822,009, filed on May 10, 2013.

(51) Int. Cl.
  *G11C 11/00* (2006.01)
  *G11C 13/00* (2006.01)
  *G11C 7/12* (2006.01)

(52) U.S. Cl.
  CPC ........ *G11C 13/0023* (2013.01); *G11C 13/0002* (2013.01); *G11C 13/004* (2013.01); *G11C 13/0007* (2013.01); *G11C 13/0069* (2013.01); *G11C 7/12* (2013.01); *G11C 2213/71* (2013.01); *G11C 2213/72* (2013.01)

(58) Field of Classification Search
  CPC ........... G11C 13/0069; G11C 2213/71; G11C 13/0002; G11C 2213/72; G11C 2213/77; G11C 7/12; G11C 13/0026; G11C 13/0028; G11C 11/4087
  USPC ................... 365/148, 63, 129, 158, 163, 175, 365/189.011, 230.01, 230.03, 230.06, 365/230.08
  See application file for complete search history.

(56) References Cited

FOREIGN PATENT DOCUMENTS

| JP | 2009-4725 | 1/2009 |
|---|---|---|
| JP | 2009-266312 | * 11/2009 |
| JP | 2010-251479 | 11/2010 |
| JP | 2011-60389 | 3/2011 |

* cited by examiner

*Primary Examiner* — Fernando Hidalgo
(74) *Attorney, Agent, or Firm* — Oblon, McClelland, Maier & Neustadt, L.L.P.

(57) ABSTRACT

According to one embodiment, a memory includes memory cells between first conductive lines and second conductive lines. A control circuit is configured to apply a first potential to a first end of a selected first conductive line connected to the selected memory cell among the first conductive lines and first ends of unselected second conductive lines not connected to the selected memory cell among the second conductive lines, apply a second potential larger than the first potential to a first end of a selected second conductive line connected to the selected memory cell among the second conductive lines, apply third potentials smaller than the second potential to first ends of unselected first conductive lines not connected to the selected memory cell among the first conductive lines respectively, and change values of the third potentials based on an address of the selected first conductive line.

30 Claims, 32 Drawing Sheets

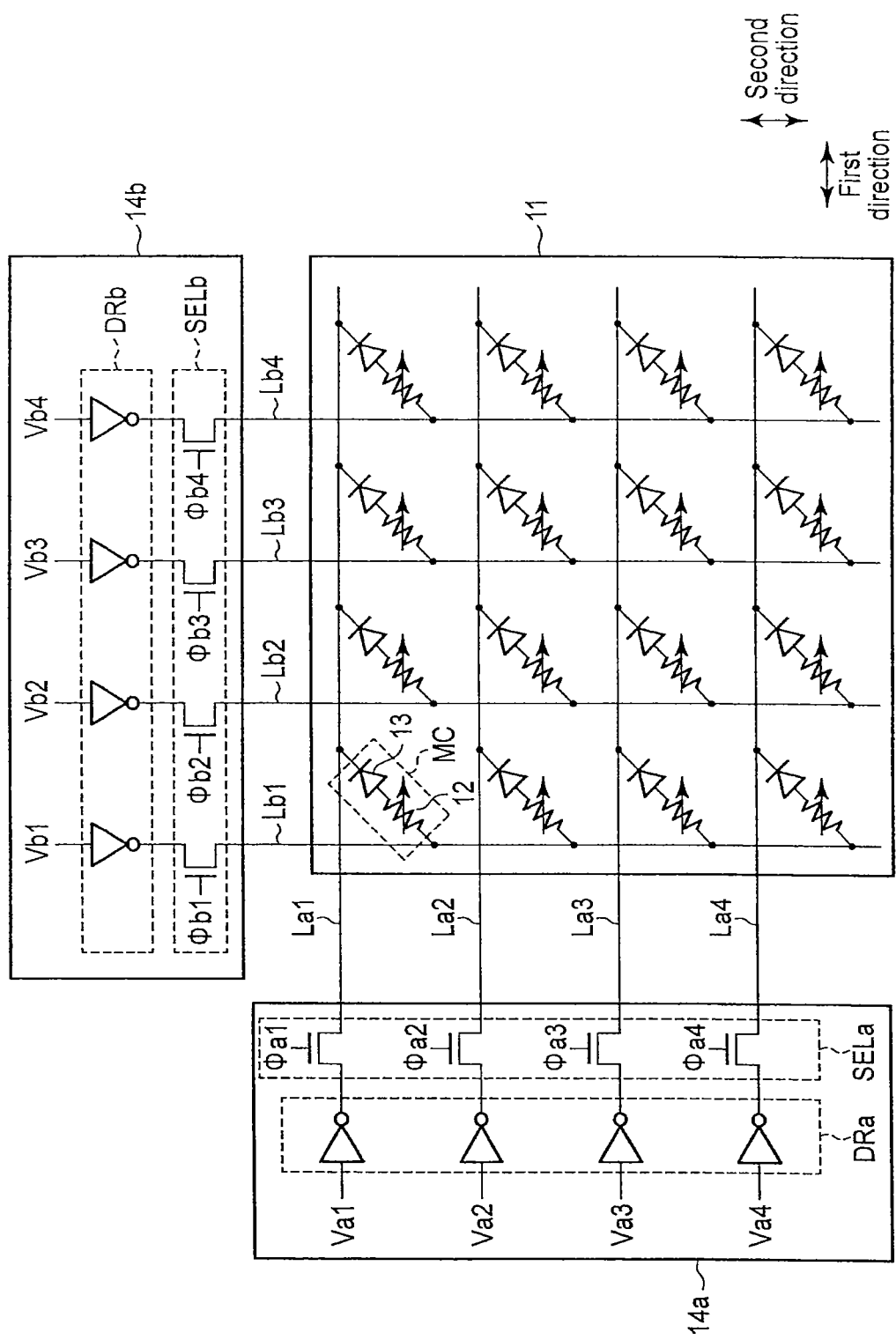
F I G. 2

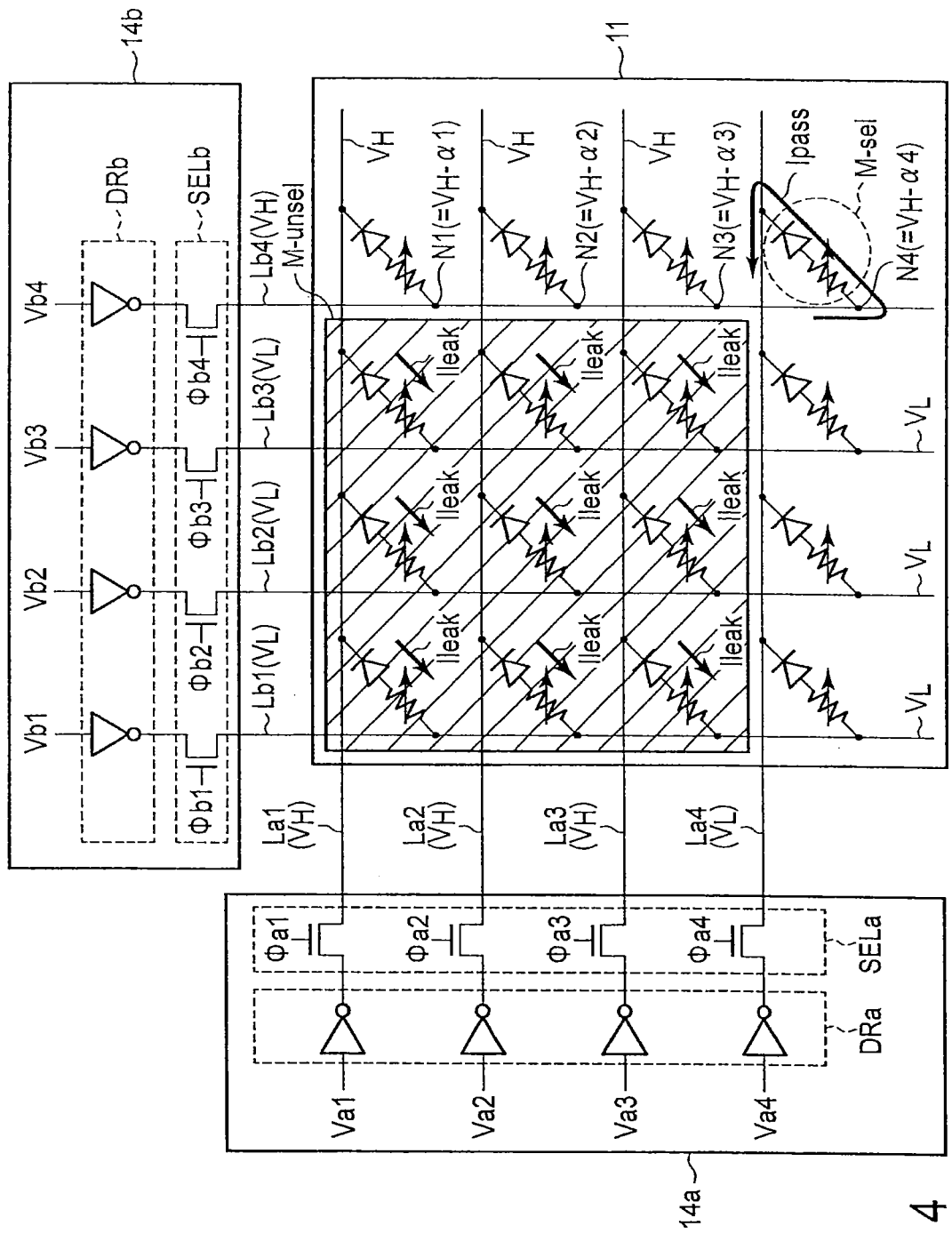
F I G. 4

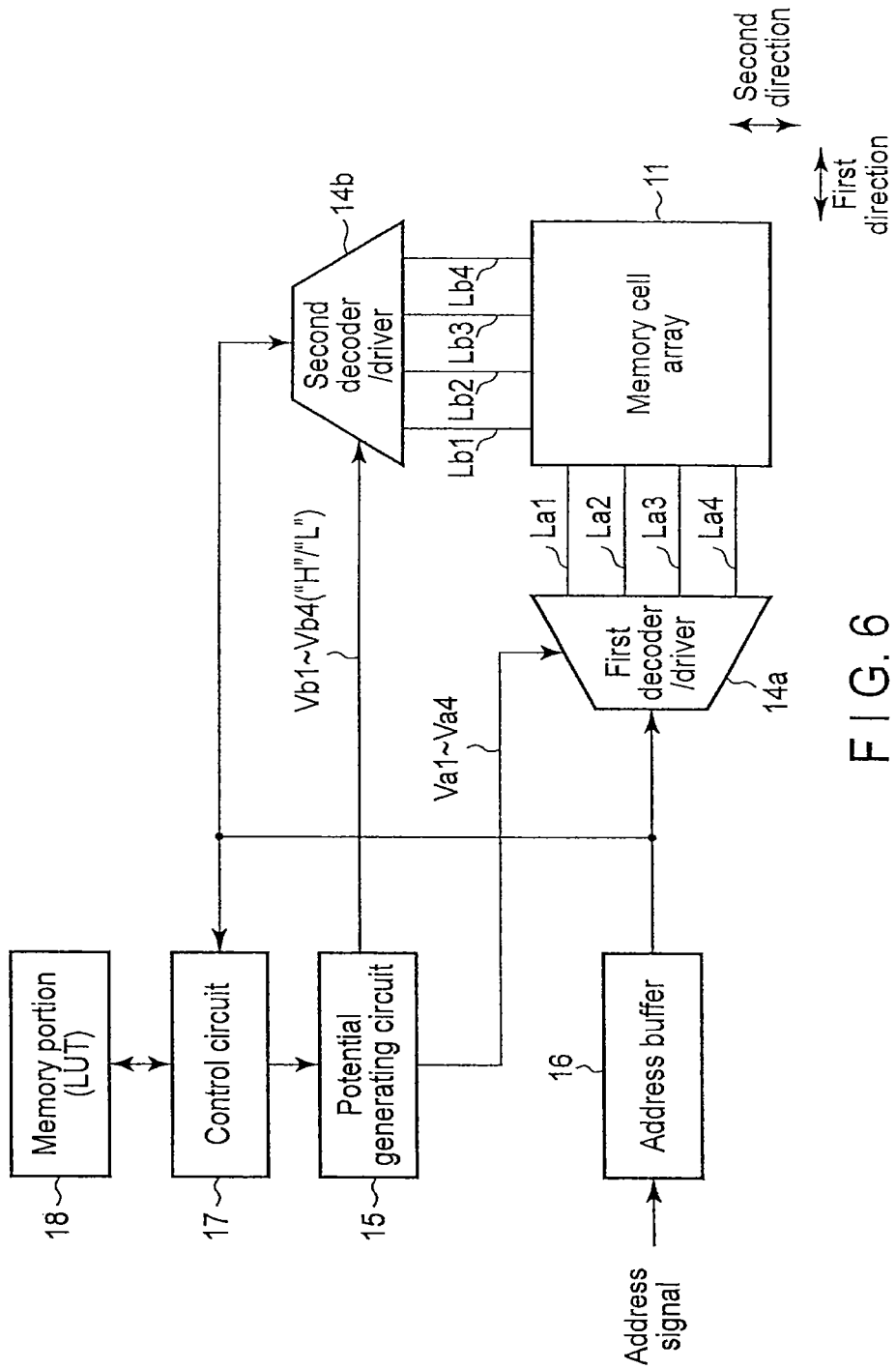
F I G. 6

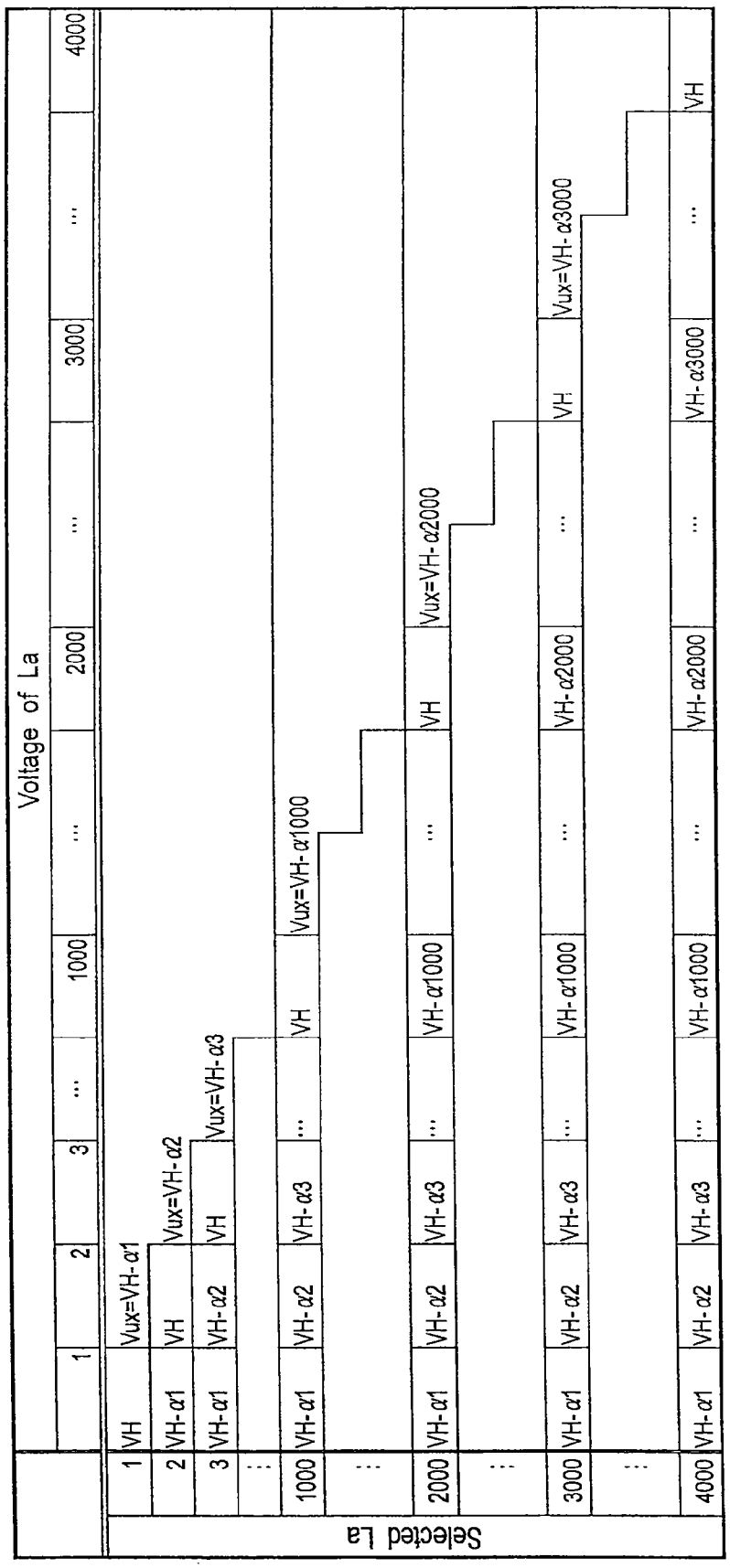
F I G. 9

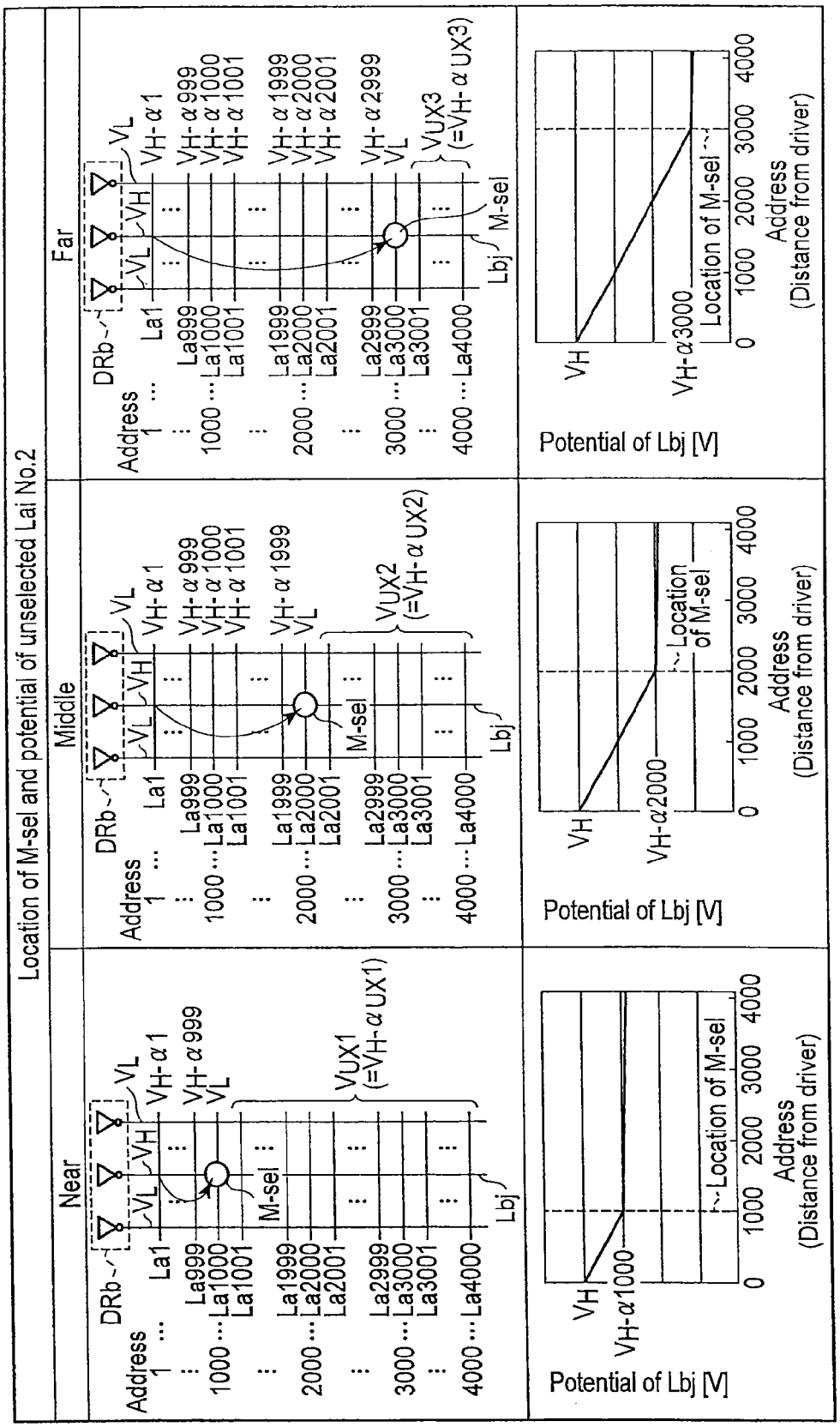
F I G. 10

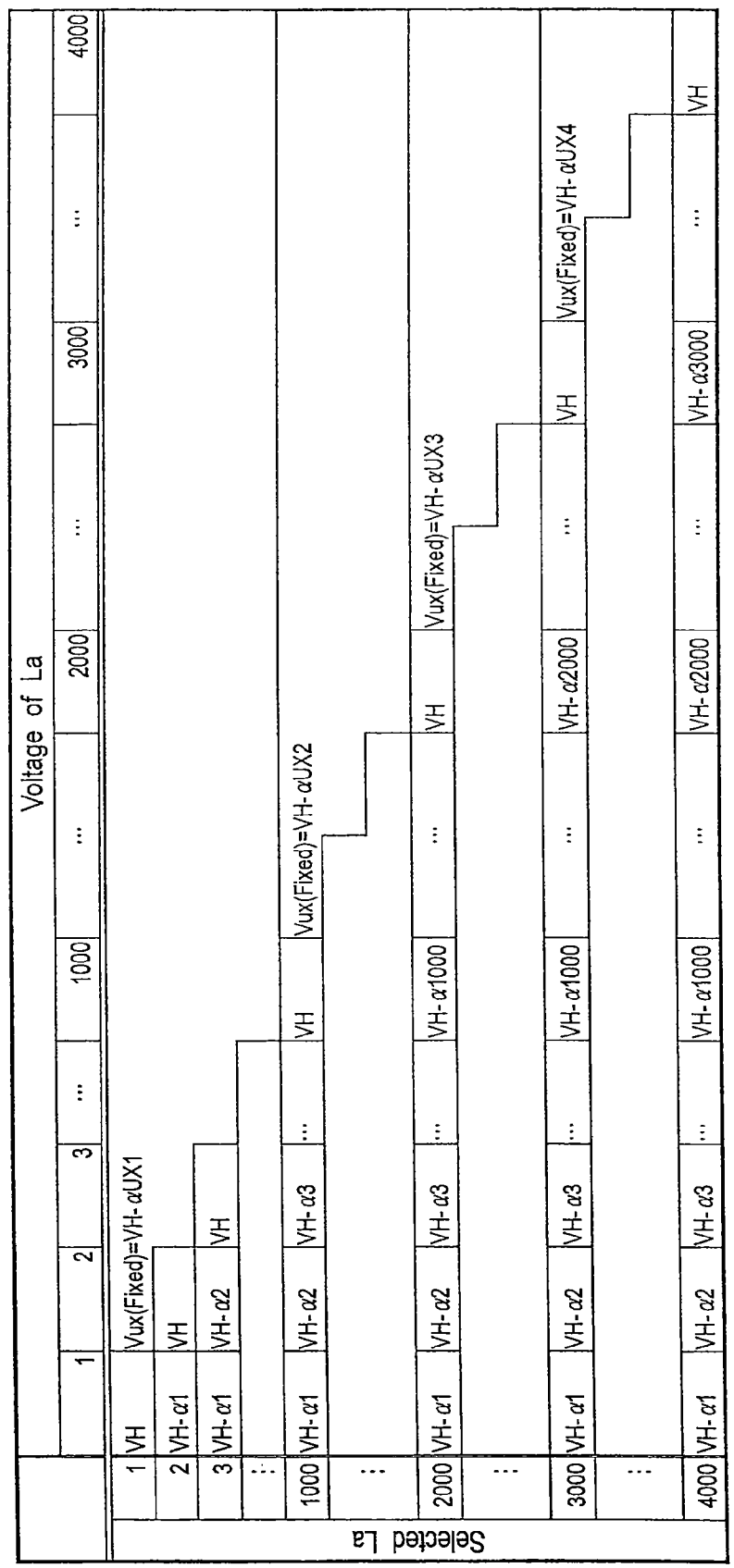
F I G. 11

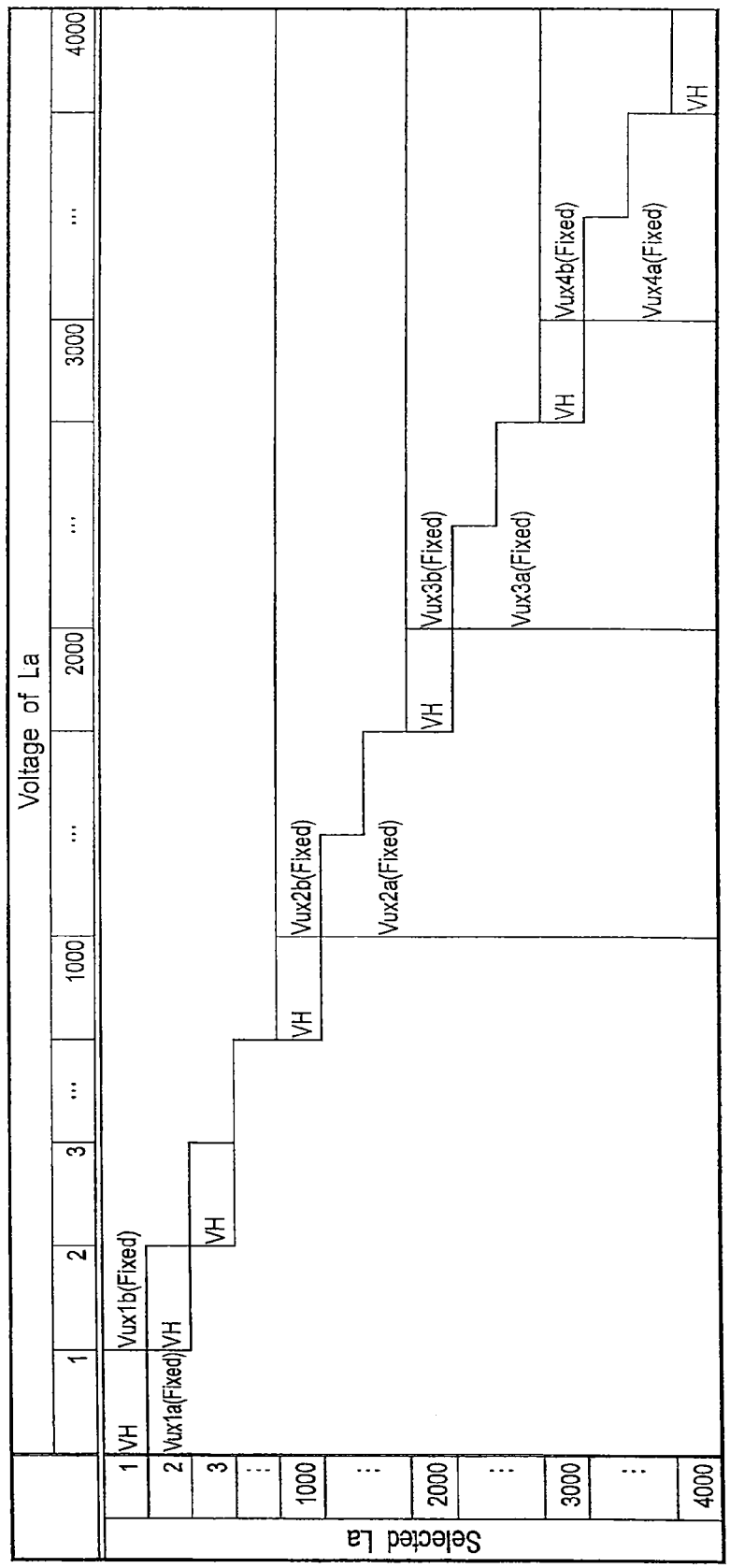
F I G. 15

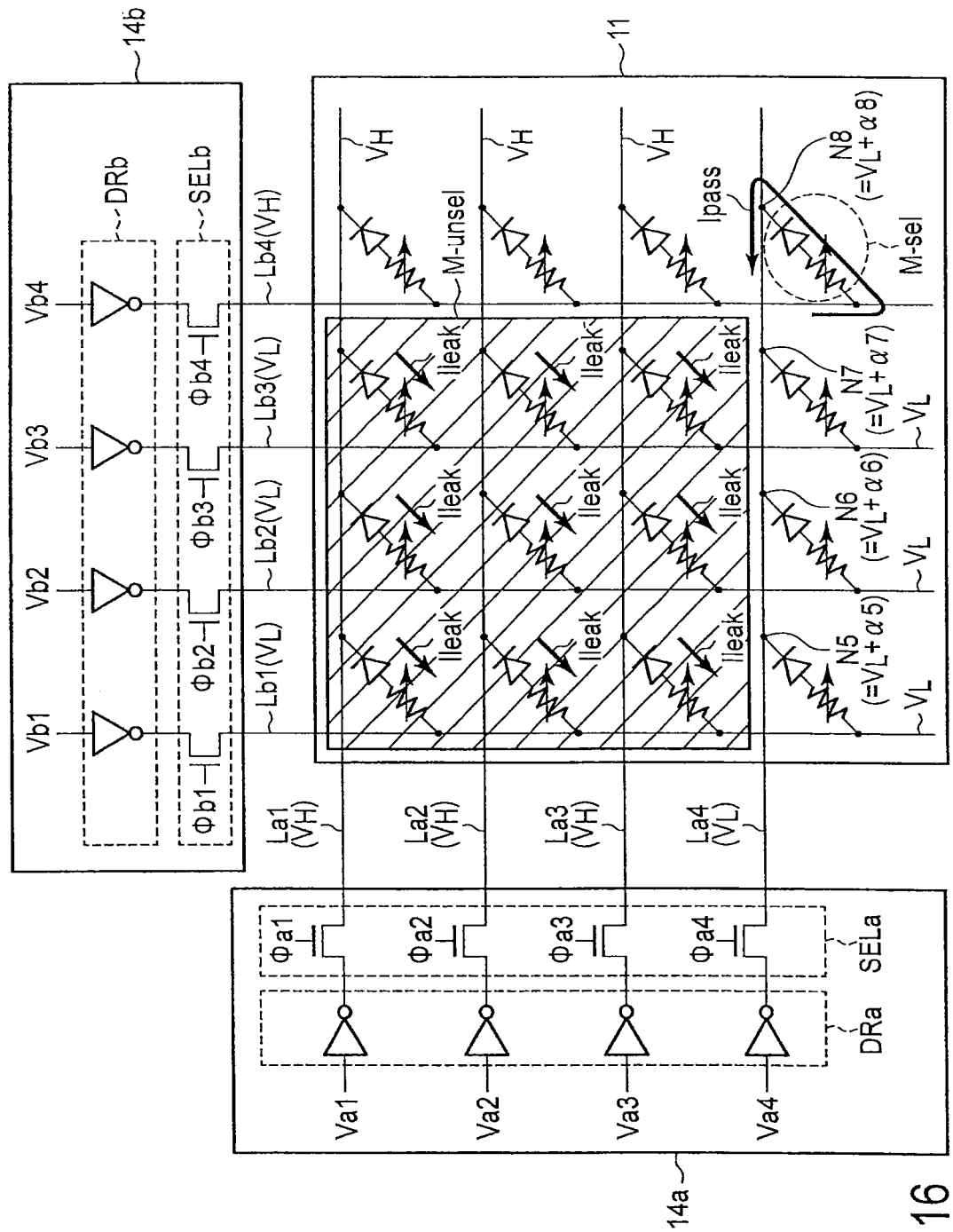
F I G. 16

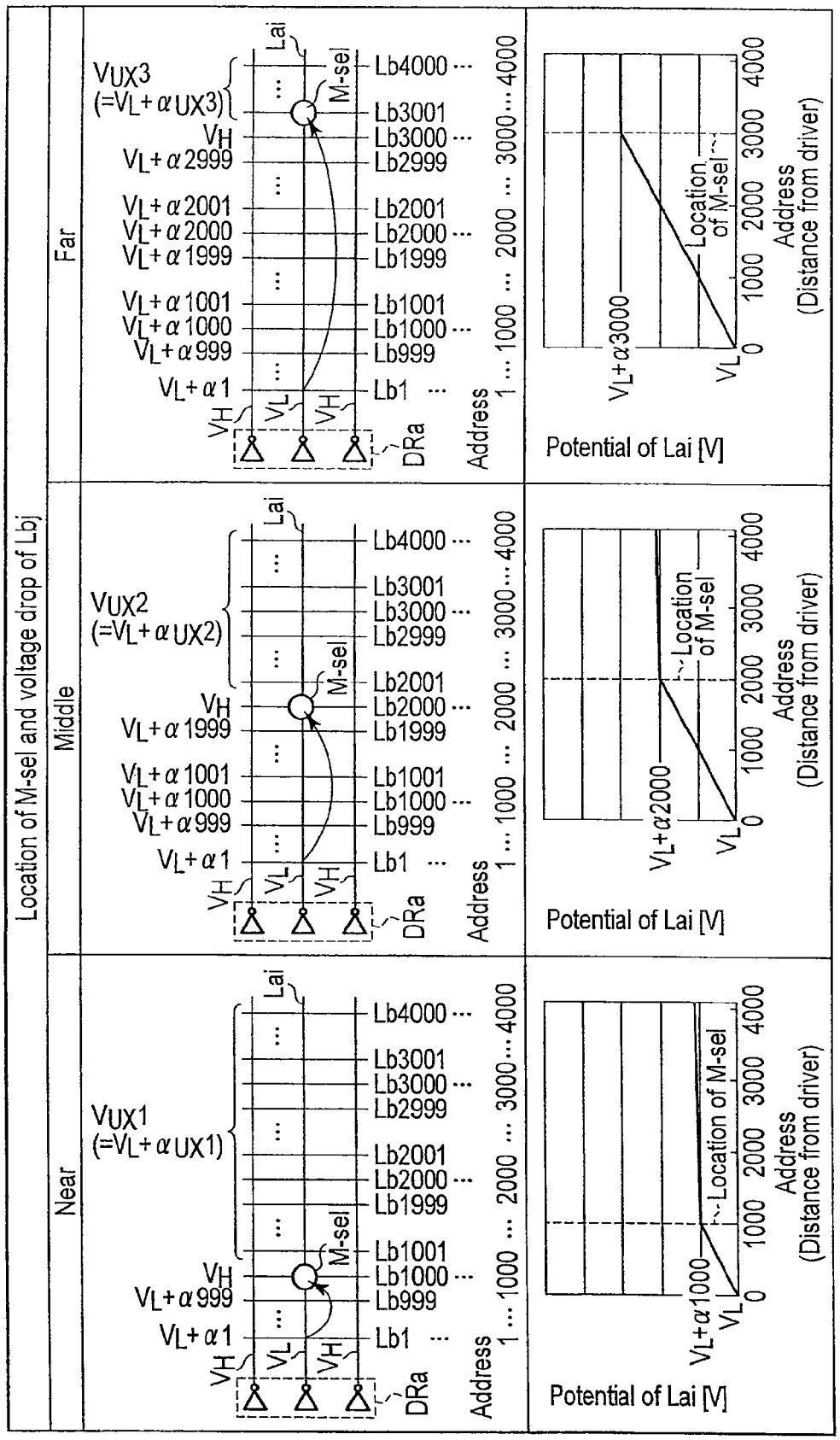
F I G. 21

| | Table No.4 | | |
|---|---|---|---|
| | Address of M-sel (Selected second conductive line) | Potential of unselected Lai which is located at DRb side of M-sel | Potential of unselected Lai which is located at oppsite side of DRb side of M-sel |
| Block B1 | 1<br>2<br>3<br>⋮<br>1000 | V$_{UX1a-1}$(Fixed) | V$_{UX1b}$(Fixed) |
| Block B2 | 1001<br>⋮<br>2000 | • Unselected Lai in block B1<br>→V$_{UX1a-2}$(Fixed)<br>• Unselected Lai in block B2<br>→V$_{UX2a-1}$(Fixed) | V$_{UX2b}$(Fixed) |
| Block B3 | 2001<br>⋮<br>3000 | • Unselected Lai in block B1<br>→V$_{UX1a-3}$(Fixed)<br>• Unselected Lai in block B2<br>→V$_{UX2a-2}$(Fixed)<br>• Unselected Lai in block B3<br>→V$_{UX3a-1}$(Fixed) | V$_{UX3b}$(Fixed) |
| Block B4 | 3001<br>⋮<br>3999<br>4000 | • Unselected Lai in block B1<br>→V$_{UX1a-4}$(Fixed)<br>• Unselected Lai in block B2<br>→V$_{UX2a-3}$(Fixed)<br>• Unselected Lai in block B3<br>→V$_{UX3a-2}$(Fixed)<br>• Unselected Lai in block B4<br>→V$_{UX4a-1}$(Fixed) | V$_{UX4b}$(Fixed) |

F I G. 28

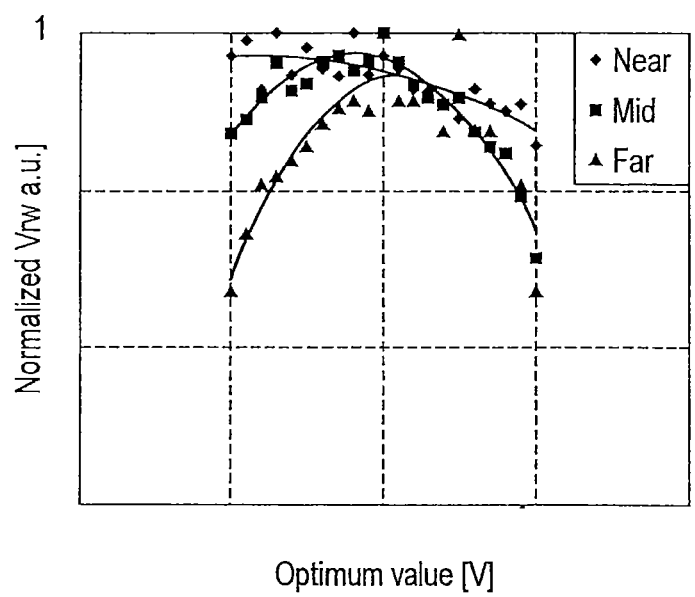
F I G. 29
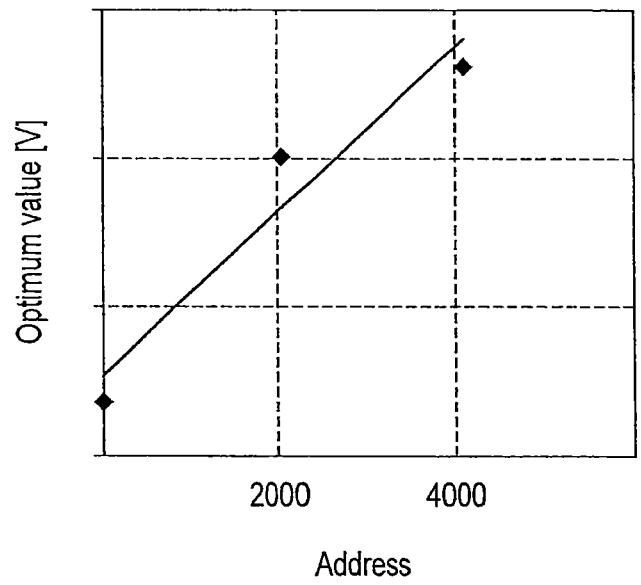
F I G. 30

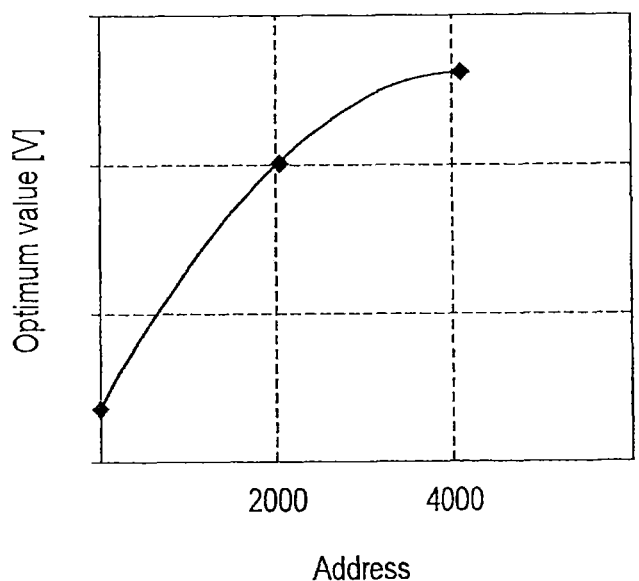
F I G. 31
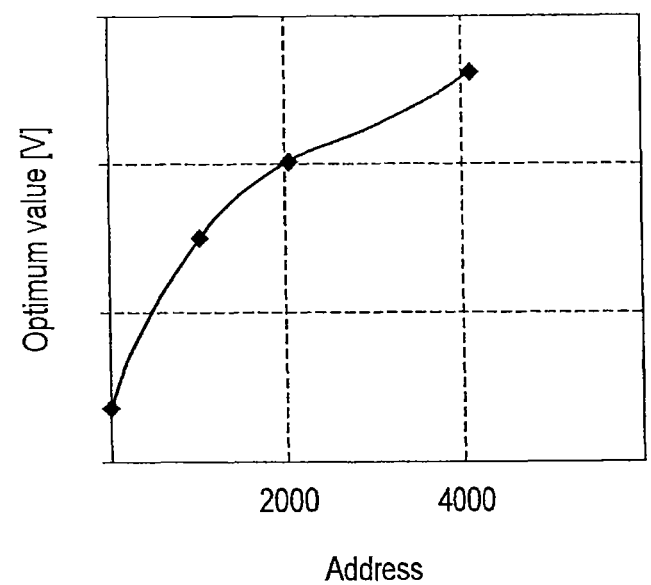
F I G. 32

RESISTANCE CHANGE MEMORY

CROSS-REFERENCE TO RELATED APPLICATIONS

This application claims the benefit of U.S. Provisional Application No. 61/822,009, filed May 10, 2013, the entire contents of which are incorporated herein by reference.

FIELD

Embodiments described herein relate generally to a resistance change memory.

BACKGROUND

A memory cell array of a resistance change memory having a cross-point type has been considered. For example, the cross-point type is an array structure comprising first conductive lines (e.g., word lines), second conductive lines (e.g., bit lines), and memory cells arranged between these lines.

In an operation mode that a voltage or a current is applied to one selected memory cell, leak currents may flow through many other unselected memory cells in some cases. When a sum of the leak currents turns to a sneak current, the voltage or the current applied to the selected memory cell is reduced.

Therefore, to apply the voltage or the current which changes resistance to the selected memory cell, an operation voltage becomes large, and a consumption current is thereby increased.

BRIEF DESCRIPTION OF THE DRAWINGS

FIG. 2 is an example of a view showing a memory cell array in FIG. 1;
FIG. 4 is an example of a view showing a bias relationship in an operation mode that a current is allowed to flow through a selected memory cell;
FIG. 6 is an example of a view showing a resistance change memory that realizes a first technological concept;
FIG. 9 is an example showing a relationship between an address of a selected memory cell and potentials in the unselected first conductive lines;
FIG. 10 is an example of a view showing an example of potentials applied to unselected first conductive lines;
FIG. 11 is an example of a view showing a relationship between an address of a selected memory cell and potentials in unselected first conductive lines;
FIG. 15 is an example of a view showing a relationship between an address of a selected memory cell and potentials in unselected first conductive lines;
FIG. 16 is an example of a view showing a bias relationship in an operation mode that a current is allowed to flow through a selected memory cell;
FIG. 21 is an example of a view showing an example of potentials applied to unselected second conductive lines;
FIG. 28 is an example of a view showing a relationship between an address of a selected memory cell and potentials in unselected second conductive lines;
FIGS. 29 to 32 are examples of a view showing adjusted values of unselected first/second conductive lines associated with a position of a selected memory cell.

DETAILED DESCRIPTION

In general, according to one embodiment, a resistance change memory comprises: first conductive layers extending in a first direction, and arranged in a second direction intersect with the first direction; second conductive layers extending in the second direction, and arranged in the first direction; memory cells between the first conductive lines and the second conductive lines; a first driver/decoder connected to first ends of the first conductive lines; a second driver/decoder connected to first ends of the second conductive lines; a potential generating circuit generating a potential which is applied to the first ends of the first conductive lines and the first ends of the second conductive lines; and a control circuit controlling a operation mode which applies a voltage or a current to a selected memory cell among the memory cells. Each of the memory cells comprises a rectifying element and a resistance change element connected in series. The control circuit is configured, in the operation mode, to: apply a first potential to a first end of a selected first conductive line connected to the selected memory cell among the first conductive lines and first ends of unselected second conductive lines not connected to the selected memory cell among the second conductive lines, apply a second potential larger than the first potential to a first end of a selected second conductive line connected to the selected memory cell among the second conductive lines, apply third potentials smaller than the second potential to first ends of unselected first conductive lines not connected to the selected memory cell among the first conductive lines respectively, and change values of the third potentials based on an address of the selected first conductive line.

Embodiments will now be described hereinafter with reference to the drawings.

1. RESISTANCE CHANGE MEMORY

(1) Comparative Example

Figure 1:
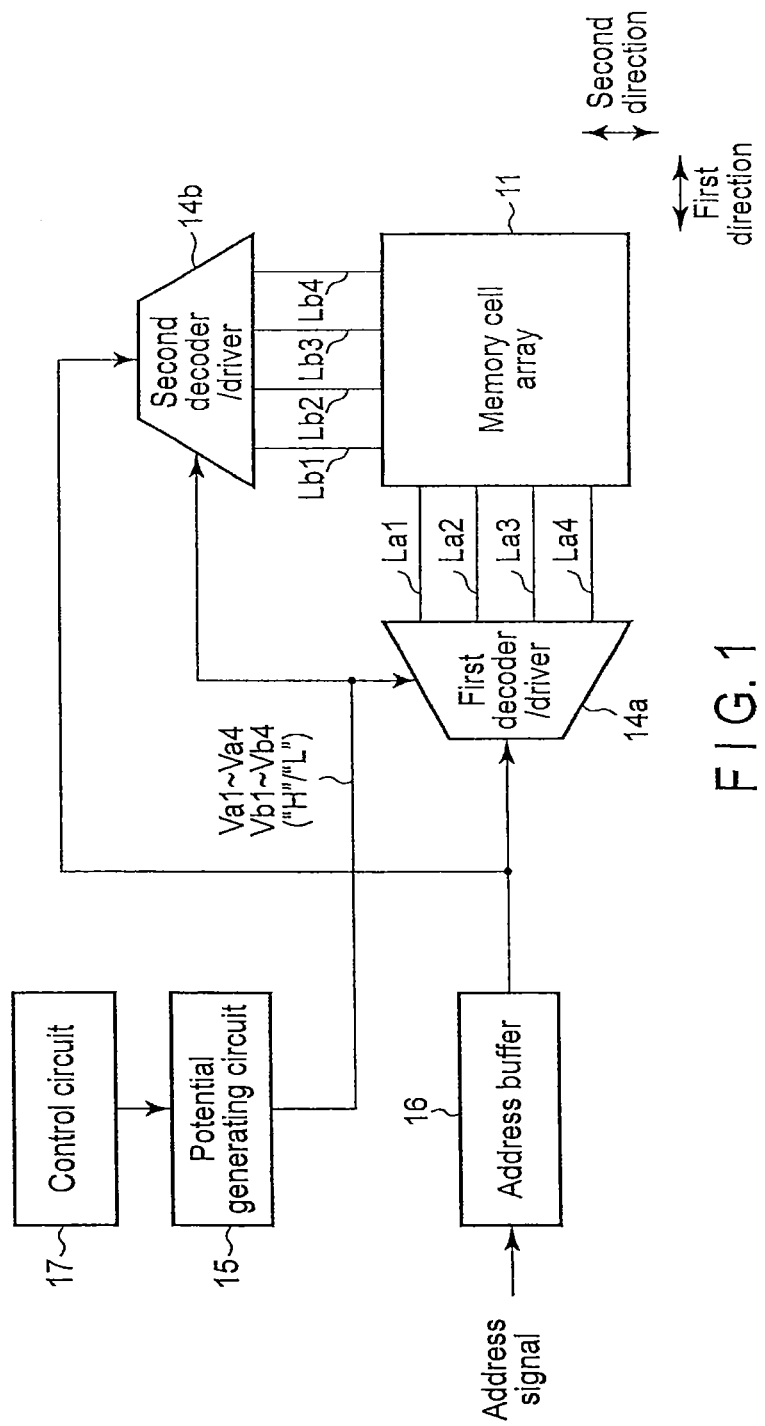
FIG. 1 is an example of a system block of a resistance change memory according to a comparative example.

FIG. 1 shows an example of a system block of a resistance change memory according to a comparative example. FIG. 2 shows an example of a memory cell array.

A memory cell array 11 is of a cross-point type. That is, memory cells MC are arranged between first conductive lines La1, ... La2, La3, and La4 that are extended in a first direction and aligned in a second direction and second conductive lines Lb1, ... Lb2, Lb3, and Lb4 that are extended in the second direction and aligned in the first direction.

In this example, to simplify the explanation, the number of the first conductive lines La1, ... La2, La3, and La4 or the second conductive lines Lb1, ... Lb2, Lb3, and Lb4 is four, but the present invention is not restricted thereto.

Each memory cell MC comprises a resistance change element 12 and a rectifying element 13 that are connected in series.

The resistance change element 12 is an element that can electrically switch two or more resistance values which are different from each other. For example; in case of storing two values (1 bit) in the resistance change element 12, a resistance value in the resistance change element 12 is changed in two patterns (a low-resistance state/a high-resistance state).

The resistance change element 12 comprises a resistance change material whose resistance value varies depending on a voltage or a current. As the resistance change material, there are metal oxides, e.g., an Al oxide, an Hf oxide, a Ti oxide, and an La oxide, or a mixture of these materials.

An initial state of the resistance change element 12 is, e.g., a high-resistance state. This is an example, and the initial state of the resistance change element 12 may be set to a low-resistance state. In general, an operation for changing the resistance value in the resistance change element 12 from the high-resistance state to the low-resistance state is called a set operation. The set operation is performed by, e.g., applying a set voltage to the resistance change element 12.

Further, in general, an operation for changing the resistance value in the resistance change element 12 from the low-resistance state to the high-resistance state is called a reset operation. The reset operation is performed by, e.g., applying a reset voltage to the resistance change element 12 and allowing a reset current to flow through the resistance change element 12.

The rectifying element 13 is, e.g., a diode. It is to be noted that the rectifying element 13 may be unnecessary in some cases.

When the resistance change element 12 is of a unipolar type, the rectifying element 13 is, e.g., a PIN diode. Furthermore, when the resistance change element 12 is of a bipolar type, the rectifying element 13 may be, e.g., an MIM diode.

Figure 3:
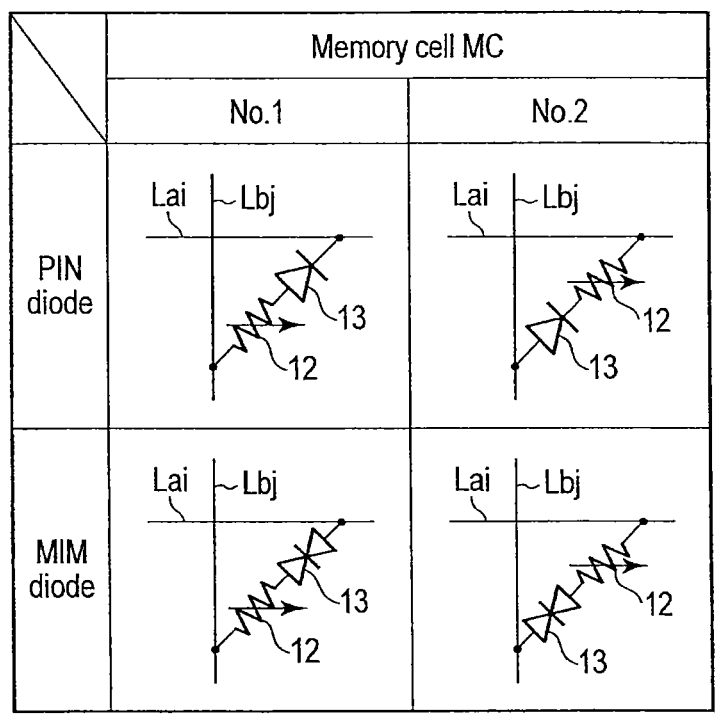
FIG. 3 is an example of a view showing a connecting relationship between a resistance change element and a rectifying element.

For example, as shown in FIG. 3, as a connecting relationship between the resistance change element 12 and the rectifying element 13, there are two patterns, i.e., a case (No. 1) where the resistance change element 12 is provided on a second conductive line Lbj side and the rectifying element 13 is provided on a first conductive line Lai side and a case (No. 2) where the resistance change element 12 is provided on the first conductive line Lai side and the rectifying element 13 is provided on the second conductive line Lbj side.

A first decoder/driver 14a is connected to one end of each of the first conductive lines La1, ... La2, La3, and La4. The first decoder/driver 14a comprises a selection transistor SELa and an inverter DRa as a driver. ON/OFF of the selection transistor SELa is controlled by selection signals φa1, φa2, φa3, and φa4 obtained by decoding address signals.

A second decoder/driver 14b is connected to one end of each of the second conductive lines Lb1, ... Lb2, Lb3, and Lb4. The second decoder/driver 14b comprises a selection transistor SELb and an inverter DRb as a driver. ON/OFF of the selection transistor SELb is controlled by selection signals φb1, φb2, φb3, and φb4 obtained by decoding address signals.

A potential generating circuit 15 generates potentials Va1, ... Va2, Va3, and Va4 applied to one end of each of the conductive lines La1, ... La2, La3, and La4 and potentials Vb1, ... Vb2, Vb3, an Vb4 applied to one end of each of the second conductive lines Lb1, ... Lb2, Lb3, and Lb4.

In this example, these potentials Va1, ... Va2, Va3, Va4, Vb1, ... Vb2, Vb3, and Vb4 are defined by "H" or "L". "H" represents a high-level potential and means, e.g., a power supply potential Vdd. Further, "L" represents a low-level potential and means, e.g., a ground potential Vss.

Address signals are input to first and second decoders/drivers 14a and 14b through an address buffer 16. The first and second decoders/drivers 14a and 14b generate selection signals φa1, φa2, φa3, φa4, φb1, φb2, φb3, and φb4 based on the address signals.

A control circuit 17 determines values of the potentials Va1, ... Va2, Va3, and Va4 applied to one end of each of the first conductive lines La1, ... La2, La3, and La4 and values of the potentials Vb1, ... Vb2, Vb3, and Vb4 applied to one end of each of the second conductive lines Lb1, ... Lb2, Lb3, and Lb4 in a write operation (set/reset) operation and a read operation, and supplies these values to the potential generating circuit 15.

(2) Bias Relationship in Comparative Example

FIG. 4 shows a bias relationship in a comparative example.

A selected memory cell M-sel which is a target of the write (set/reset) operation or the read operation is connected between the first conductive line La4 and the second conductive line Lb4.

In this case, the potential Va4 applied to one end of the selected first conductive line La4 is set to $V_L$ (e.g., the ground potential Vss), and the potential Vb4 applied to one end of the selected second conductive line Lb4 is set to $V_H$ (e.g., the power supply potential Vdd).

Therefore, a forward bias is applied to a diode in the selected memory cell M-sel, and a current Ipass flows through a resistance change element in the selected memory cell M-sel.

Further, to avoid erroneously writing data into unselected memory cells excluding the selected memory cell M-sel, the potentials Va1, ... Va2, and Va3 applied to one end of each of the unselected first conductive lines La1, ... La2, and La3 are set to $V_H$ (e.g., the power-supply potential Vdd), and the potentials Vb1, ... Vb2, and Vb3 applied to one end of each of the unselected second conductive lines Lb1, ... Lb2, and Lb3 are set to $V_L$ (e.g., the ground potential Vss).

Therefore, the bias is not applied to the unselected memory cells connected to the selected first conductive line La4 (potentials at both ends of each unselected memory cell are both $V_L$), and hence erroneous writing is avoided.

Likewise, the bias is not applied to the unselected memory cells connected to the selected second conductive line Lb4 (potentials at both ends of each unselected memory cell are both $V_H$), and hence erroneous writing is avoided.

A bias relationship is collectively shown in Table 1.

TABLE 1

Write/Read (Set/Reset) of M-sel

| La1 | $V_H$ | Lb1 | $V_L$ |
| La2 | $V_H$ | Lb2 | $V_L$ |
| La3 | $V_H$ | Lb3 | $V_L$ |
| La4 | $V_L$ | Lb4 | $V_H$ |

However, a backward bias is applied to the diode in each of the unselected memory cells (memory cells in a hatched region) connected between the unselected first conductive lines La1, ... La2, and La3 and the unselected second conductive lines Lb1, ... Lb2, and LB3. As a result, a leak current Ileak flows in each of these unselected memory cells. Although a value of each of the leak currents Ileak is very small, but the number of the unselected memory cells in which the leak currents Ileak become huge, and hence a sum may be a considerable value in some cases.

This sum turns to a so-called sneak current and increases a consumption current. Therefore, in an operation mode that a voltage or a current is applied to the selected memory cell M-sel, it is preferable to suppress the sneak current and efficiently apply a predetermined voltage or current to the selected memory cell M-sel.

(3) Focus Point

Attention is turned to a voltage drop in each of the selected first conductive line and the selected second conductive line to which the selected memory cell is connected.

First, the voltage drop in the selected second conductive line will be described.

Figure 5:
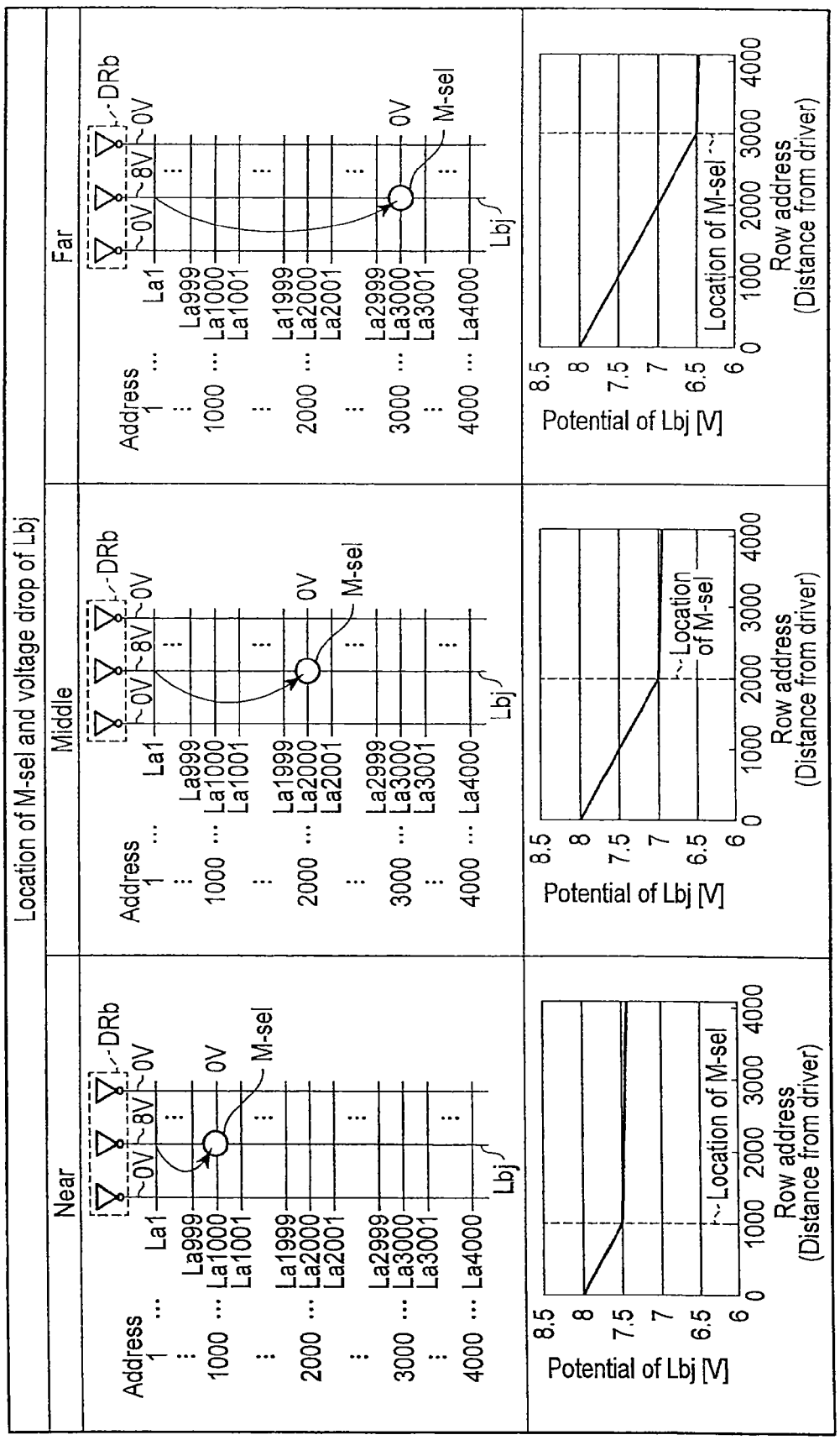
FIG. 5 is an example of a view showing a relationship between a position of a selected memory cell and a voltage drop.

FIG. 5 shows an example of a simulation result of the voltage drop in the selected second conductive line Lbj to which the selected memory cell M-sel is connected.

In this example, to simplify the explanation, a potential applied to one end of the selected second conductive line Lbj is assumed to be 8 V.

Furthermore, addresses mean addresses (e.g., row addresses) of the first conductive lines La1, ... La4000. In this examples, the addresses are represented as 1 to 4000, but the present invention is not restricted thereto. The number of the addresses may be above or below these numbers.

Moreover, the addresses are assumed to sequentially increase from the inverter DRb side that drives the second conductive lines toward its opposite side.

This simulation enables verifying how the voltage drop in the selected second conductive line Lbj varies in accordance with its position (corresponding to the address of each first conductive line) based on a wiring resistance of the selected second conductive line Lbj.

As shown on the lower side in FIG. 5, a potential in the selected second conductive line Lbj substantially linearly (linear-functionally) lowers from one end of the driver DRb side of the selected second conductive line Lbj toward a position (an address) of the selected memory cell M-sel.

For example, when the address of the selected memory cell M-sel is 1000 (corresponding to Near), the potential in the selected second conductive line Lbj gradually lowers from the address 1 toward the address 1000, and it becomes approximately 7.5 V at the address 1000 corresponding to the position of the first conductive line La1000. In this case, the voltage drop in the second conductive line Lbj is hardly observed at the address 1001 corresponding to a position of the first conductive line La1001 and subsequent addresses.

Additionally, for example, when the address of the selected memory cell M-sel is 2000 (corresponding to Middle), the potential in the selected second conductive line Lbj gradually lowers from the address 1 toward the address 2000, and it becomes approximately 7 V at the address 2000 corresponding to a position of the first conductive line La2000. In this case, the voltage drop in the second conductive line Lbj is hardly observed at the address 2001 corresponding to a position of the first conductive line La2001 and subsequent addresses.

Further, for example, when the address of the selected memory cell M-sel corresponding to the position of the first conductive line La3000 is 3000 (corresponding to Far), the potential in the selected second conductive line Lbj gradually lowers from the address 1 toward the address 3000, and it becomes approximately 6.5 V at the address 3000. In this case, the voltage drop in the second conductive line Lbj is hardly observed at the address 3001 corresponding to a position of the first conductive line La3001 and subsequent addresses.

The voltage drops are collectively shown in Table 2.

TABLE 2

Voltage drop of Lb4

| Node | Voltage |
| --- | --- |
| N1 | $V_H - \alpha 1$ |
| N2 | $V_H - \alpha 2$ |
| N3 | $V_H - \alpha 3$ |
| N4 | $V_H$ |

However, Lb4 in Table 2 corresponds to the second conductive line Lb4 in FIG. 4, and N1 to N4 in Table 2 correspond to nodes N1 to N4 of the second conductive line Lb4 in FIG. 4. It is to be noted that a selected first wiring line is the first conductive line La4. Furthermore, $V_H$ in Table 2 is a potential (e.g., 8 V) applied to one end of the second conductive line Lb4 in FIG. 4, and $\alpha 1 < \alpha 2 < \alpha 3$ is achieved.

Therefore, focusing attention on the voltage drop in the selected second conductive line Lbj, it can be understood that the potentials in the unselected first conductive lines do not have to be uniformed to a fixed potential $V_H$, e.g., the power supply potential Vdd and they can be adjusted in accordance with, e.g., a position of the selected memory cell, namely, the address of the selected first conductive line.

Furthermore, the potentials in the unselected first conductive lines are readjusted in accordance with the address of the selected memory cell M-sel. As a result, the leak currents in the unselected memory cells can be reduced, the sneak current can be suppressed, and the consumption current can be decreased.

This point will now be described hereinafter.

However, in the following description, to simplify the explanation, it is assumed that the voltage drop in the selected second conductive line Lbj can be approximated from one end of the selected second conductive line Lbj on the driver DRb side to the position (the address) of the selected memory cell M-sel by using a linear function.

It is to be noted that, in reality, the voltage drop in the selected second conductive line Lbj may be intricately changed due to the position of the selected memory cell M-sel (which is the address of the selected second conducive, line Lbj in particular), an influence from the unselected first conductive lines (capacitance coupling), and the like.

That is, it may be desirable to approximate the voltage drop in the selected second conductive line Lbj from one end of the selected second conductive line Lbj on the driver DRb side to the position (the address) of the selected memory cell M-sel by using a quadratic function, a cubic function, or an nth-order function (n is a natural number equal to or higher than 2) in some cases.

2. FIRST TECHNOLOGICAL CONCEPT

Figure 7:
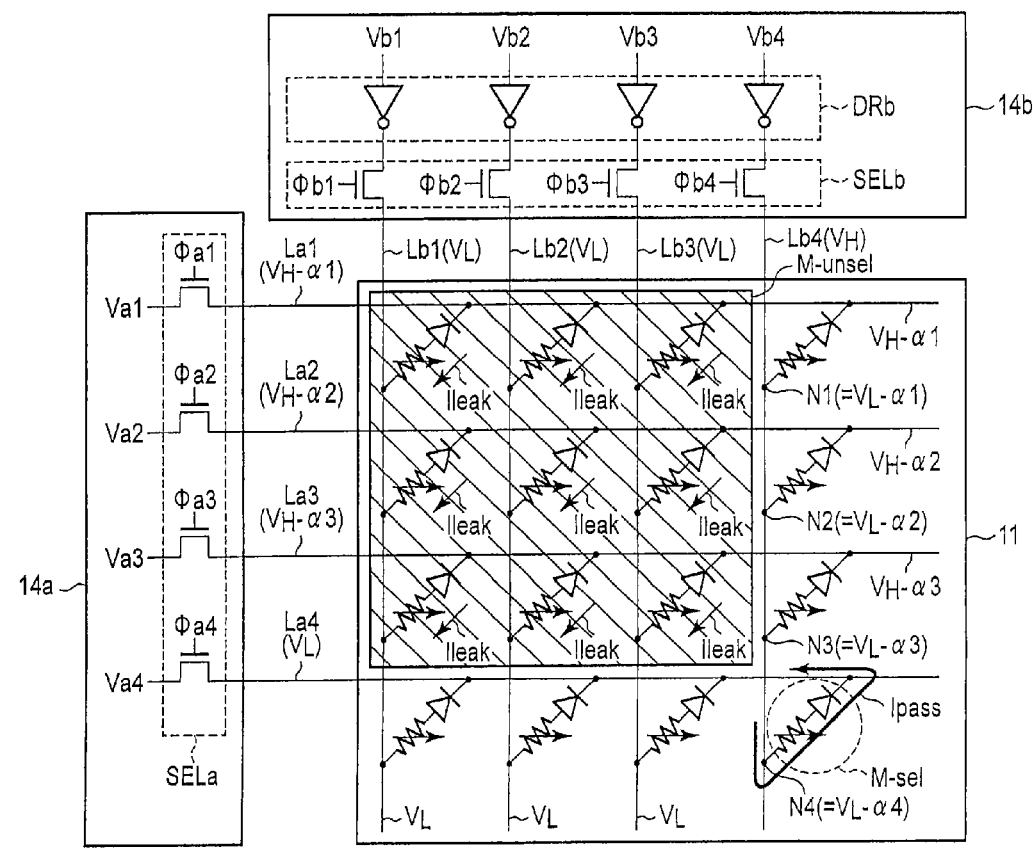
FIG. 7 is an example of a view showing a bias relationship in an operation mode that a current is allowed to flow through a selected memory cell.

FIG. 6 shows an example of a system block of a resistance change memory that realizes the first technological concept. FIG. 7 shows an example of a memory cell array.

In these drawings, like reference numerals denote elements equal to those in FIG. 1 and FIG. 2, thereby omitting a detailed description thereof. Moreover, like FIG. 4, it is assumed that a selected memory cell M-sel is connected between the first conductive line La4 and the second conductive line Lb4.

Structural characteristics of this resistance change memory lie in that: an address signal indicative of a position (an address) of the selected memory cell M-sel (an address signal that designates the selected first conductive line La4) is input to the control circuit 17; any one of the potentials Va1, . . . Va2, and Va3 applied to one end of each of the unselected first conductive lines La1, . . . La2, and La3 output from the potential generating circuit 15 is adjusted in accordance with the address of the selected memory cell M-sel; and adjustment values of the potentials Va1, Va2, and Va3 applied to one end of each of the unselected first conductive lines La1, . . . La2, and La3 are determined based on an LUT (Look up table) in a memory portion 18.

Further, the first decoder/driver 14a does not have to have the inverter DRa in FIG. 4 in order to apply each of the potentials Va1, . . . Va2, and Va3 adjusted in accordance with the address of the selected memory cell M-sel to one end of each of the unselected first conductive lines La1, . . . La2, and La3. In this case, each of the potentials Va1, . . . Va2, Va3, and Va4 is applied to one end of each of the unselected first conductive lines La1, . . . La2, La3, and La4 through the selection transistor SELa.

In the first technological concept, at the time of performing the write operation or the read operation with respect to the selected memory cell M-sel, a potential applied to one end of each of the unselected first conductive lines La1, . . . La2, and La3 is adjusted based on the address signal that designates the selected memory cell M-sel (the address signal that designates the selected first conductive line La4).

For example, the potential Va1 applied to one end of the unselected first conductive line La1 is set to $(V_H-\alpha 1)$, the potential Va2 applied to one end of the unselected first conductive line La2 is set to $(V_H-\alpha 2)$, and the potential Va3 applied to one end of the unselected first conductive line La3 is set to $(V_H-\alpha 3)$.

However, $\alpha 1$, $\alpha 2$, and $\alpha 3$ are offset values from the conventional value $V_H$ (e.g., the power supply potential Vdd).

Furthermore, assuming that the voltage drop in the selected second conductive line Lb4 can be approximated from one end of the selected second conductive line Lb4 on the driver DRb side to the position of the selected memory cell M-sel by using a linear function, the offset values $\alpha 1$, $\alpha 2$, and $\alpha 3$ have a relationship of $\alpha 1 < \alpha 2 < \alpha 3$.

Moreover, when the voltage drop in the selected second conductive line Lb4 is approximated by using a quadratic function, a cubic function, an nth-order function, or the like, the offset values $\alpha 1$, $\alpha 2$, and $\alpha 3$ may have a relationship other than $\alpha 1 < \alpha 2 < \alpha 3$, e.g., $\alpha 1 < \alpha 2 > \alpha 3$ or $\alpha 1 > \alpha 2 > \alpha 3$ in some cases.

On the other hand, the potential Va4 applied to one end of the selected first conductive line La4 is set to $V_L$ (e.g., the ground potential Vss) like the comparative example, and the potential Vb4 applied to one end of the selected second conductive line Lb4 is also set toe $V_H$ (e.g., the power supply potential Vdd) like the comparative example.

Therefore, a forward bias is applied to the diode in the selected memory cell M-sel, and the current Ipass flows through the resistance change element in the selected memory cells M-sel.

Additionally, the potentials Vb1, . . . Vb2, and Vb3 applied to one end of each of the unselected second conductive lines Lb1, . . . Lb2, and Lb3 are also set to $V_L$ (e.g., the ground potential Vss).

Therefore, since the bias is not applied to the unselected memory cells connected to the selected first conductive line La4 (potentials at both ends of each unselected memory cell are both $V_L$), erroneous writing is avoided.

Likewise, since the bias is not applied to the unselected memory cells connected to the selected second conductive line Lb4, erroneous writing is avoided.

Specifically, a potential in the unselected first conductive line La1 and a potential in the node N1 of the selected second conductive line Lb4 are both $(V_H-\alpha 1)$, a potential in the unselected first conductive line La2 and a potential in the node N2 of the selected second conductive line Lb4 are both $(V_H-\alpha 2)$, and a potential in the unselected first conductive line La3 and a potential in the node N3 of the selected second conductive line Lb4 are both $(V_H-\alpha 3)$.

The bias relationship is collectively shown in Table 3.

TABLE 3

| Write/Read (Set/Reset) of M-sel | | | |
|---|---|---|---|
| La1 | $V_H - \alpha 1$ | Lb1 | $V_L$ |
| La2 | $V_H - \alpha 2$ | Lb2 | $V_L$ |
| La3 | $V_H - \alpha 3$ | Lb3 | $V_L$ |
| La4 | $V_L$ | Lb4 | $V_H$ |

As described above, according to the first technological concept, when attention is turned to the voltage drop in the selected second conductive line Lb4, the potentials Va1, . . . Va2, and Va3 applied to one end of each of the unselected first conductive lines La1, . . . La2, and La3 can be reduced to be smaller than the conventional value $V_H$ (e.g., the power supply potential Vdd).

As a result, in the unselected memory cells connected between the unselected first conductive lines La1, . . . La2, and La3 and the unselected second conductive lines Lb1, . . . Lb2, and Lb3 (the memory cells in the hatched region), a backward bias applied to each diode becomes smaller than that in the conventional example.

Therefore, the leak currents Ileak generated in the unselected memory cells also become small.

As described above, when the potentials in the unselected first conductive lines La1, . . . La2, and La3 are adjusted in accordance with the address of the selected memory cell M-sel, the leak currents in the unselected memory cells can be reduced, the sneak current can be suppressed, and a consumption current can be decreased.

3. EMBODIMENTS OF FIRST TECHNOLOGICAL CONCEPT (1) First Embodiments

Figure 8:
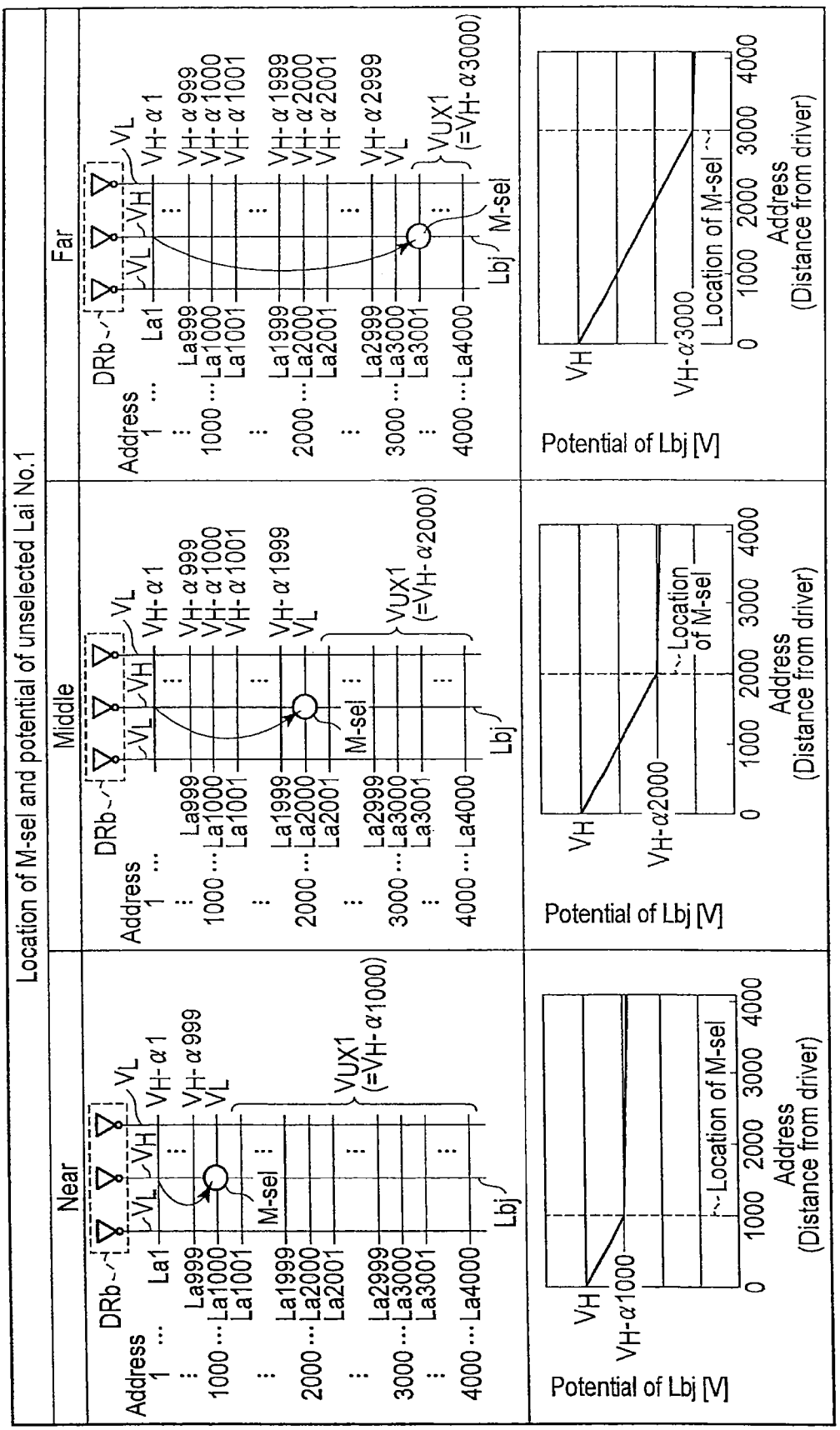
FIG. 8 is an example of a view showing an example of potentials applied to unselected first conductive lines.

FIG. 8 shows a first embodiment which is an example of determining potentials in unselected first conductive lines.

In this example, the high potential $V_H$ is applied to one end of the selected second conductive line Lbj, and the low potential $V_L$ is applied to one end of the selected first conductive line and one end of each of the unselected second conductive lines. Moreover, a position (an address) of the selected first conductive line, i.e., a position (an address) of the selected memory cell M-sel sequentially varies, and an adjustment value of the potential applied to one end of each of the unselected first conductive lines is determined in accordance with this position.

In this example, addresses of the first conductive lines La1, . . . La4000 (e.g., row addresses) are represented as 1 to 4000, respectively, but the present invention is not restricted thereto. The number of the first conductive lines (the number of the addresses) may be equal to or higher than or may be equal to or lower than these values.

Further, the addresses of the first conductive lines La1, . . . La4000 are assumed to gradually increase from the inverter DRb side that drives the second conductive lines toward the opposite side thereof.

Additionally, in this example, the position of the selected first conductive line, i.e., the position of the selected memory cell M-sel is classified into three types, i.e., an address 1000 (La1000: Near), an address 2000 (La2000: Middle), and an address 3000 (La3000: Far), and these addresses will be explained.

In this example, the control circuit 17 adjusts the potential applied to one end of each of the unselected conductive lines placed on the inverter (the driver) DRb side of the selected memory cell M-sel in accordance with each first conductive line.

For example, when the address of the selected memory cell M-sel is 1000 (Near), each of the potentials Va1, . . . Va999 applied to one end of each of the unselected first conductive lines La1, . . . La999 placed on the inverter DRb side of the selected memory cell M-sel is set to each of $V_H-\alpha1$, $V_H-\alpha999$. However, each of $\alpha1, \ldots \alpha999$ is a difference from the high potential $V_H$ (e.g., the power supply potential Vdd). Here, $\alpha1, \ldots \alpha999$ are called offset values.

The offset values $\alpha1, \ldots \alpha999$ can be determined in accordance with each first conductive line La.

For example, assuming that the voltage drop in the selected second conductive line Lbj can be approximated from one end of the inverter DRb side to the position of the selected memory cell M-sel by using the linear function as shown in the drawing, there is a relationship the offset value $\alpha1 < \ldots <$ the offset value $\alpha999$.

When the address of the selected memory cell M-sel is 2000 (Middle), there is a relationship of the offset value $\alpha1 < \ldots <$ the offset value $\alpha1999$. Further, likewise, when the address of the selected memory cell M-sel is 3000 (Far), there is a relationship of the offset value $\alpha1 < \ldots <$ the offset value a2999.

It is to be noted that it may be desirable to approximate the adjustment value (the offset value) of the potential applied to one end of each of the unselected first conductive lines placed on the inverter DRb side of the selected memory cell M-sel by using the quadratic function, the cubic function, or an nth-order function (n is a natural number equal to or higher than 2) in some situations. In such cases, the control circuit 17 individually determines the adjustment value (the offset value) of the potential in each of the unselected first conductive line in accordance with such a function.

This will be described later.

Then, the potential applied to one end of each of the unselected first conductive lines placed on the opposite side of the inverter (the driver) DRb side of the selected memory cell M-sel is set.

The potential applied to one end of each of the unselected first conductive lines (Far unselected first conductive lines) having addresses higher than that of the selected memory cell M-sel can be determined by using each adjustment value. For example, it can be said that the potential applied to one end of each of the Far unselected first conductive lines can be changed in accordance with the address of the selected memory cell M-sel. However, the potentials applied to the ends of the Far unselected first conductive lines on one side can be uniformed (the same potential).

That is because, as shown in the lower views of FIG. 8, the voltage drop in the second conductive line Lbj whose address is smaller than the selected memory cell M-sel is considerable, whereas the voltage drop in the second conductive line Lbj whose address is larger than that of the selected memory cell M-sel is nearly nothing. Thus, the control circuit 17 determines the voltage in each Far unselected first conductive line by using an adjustment value α of the selected first conductive line.

For example, when the address of the selected memory cell M-sel is 1000 (Near), the control circuit 17 sets potentials Va1001, . . . Va4000 applied to one end of each of the Far unselected first conductive lines La1001, . . . La4000 to a voltage VUX, e.g., the same value as $V_H-\alpha1000$ (a potential at an intermediate point of the selected second conductive line Lbj at the position of the selected memory cell M-sel).

Furthermore, likewise, when the address of the selected memory cell M-sel is 2000 (Middle), the control circuit 17 sets potentials Va2001, . . . Va4000 applied to one end of each of the Far unselected first conductive lines La2001, . . . La4000 to the voltage VUX, e.g., $V_H-\alpha2000$ (the potential at the intermediate point of the selected second conductive line Lbj at the position of the selected memory cell M-sel). Moreover, likewise, when the address of the selected memory cell M-sel is 3000 (Far), the control circuit 17 sets potentials Va3001, . . . Va4000 applied to one end of each of the Far unselected first conductive lines La3001, . . . La4000 to the voltage VUX, e.g., $V_H-\alpha3000$ (the potential at the intermediate point of the selected second conductive line Lbj at the position of the selected memory cell M-sel). However, the voltage VUX is not restricted to $V_H-\alpha1000$, $V_H-\alpha2000$, and $V_H-\alpha3000$, and other values may be adopted.

Thus, the relationship between the address of the selected memory cell M-sel, voltages of the potentials in the unselected first conductive lines, and the adjustment values (the DRb side and the opposite side) is collectively shown in FIG. 9. An example of a table shown in FIG. 9 is stored as, e.g., the LUT in the memory portion 18 depicted in FIG. 6.

According to the first example, since the adjustment value of the potential applied to one end of each of the unselected first conductive lines is determined in accordance with the position (the address) of the selected first conductive line, i.e., the position (the address) of the selected memory cell M-sel, each leak current (the sneak current) in the cross-point type memory cell array can be suppressed, and a low-consumption current can be achieved.

(2) Second Embodiment

FIG. 10 shows a second embodiment that determines potentials in unselected first conductive lines.

The second embodiment is a modification of the first embodiment.

As compared with the first embodiment, this example is characterized in how to determine a potential that is applied to one end of each of unselected first conductive lines (Far unselected first conductive lines) placed on the opposite side of an inverter (a driver) DRb side of a selected memory cell M-sel. Other points are the same as those in the first embodiment, thereby omitting a detailed description thereof.

In this example, the first conductive lines are classified into blocks.

For example, the first conductive lines La1, . . . La1000 having addresses 1 to 1000 are classified into a first block B1, the first conductive lines La1001, . . . La2000 having addresses 1001 to 2000 are classified into a second block B2, the first conductive lines La2001, . . . La3000 having addresses 2001 to 3000 are classified into a third block B3, and the first conductive lines La3001, . . . La4000 having addresses 3001 to 4000 are classified into a fourth block B4.

Further, the control circuit 17 sets an adjustment value of a potential applied to one end of each of Far unselected first conductive lines to a common value (the same potential) in a block to which an address of the selected memory cell M-sel, i.e., an address of a selected first conductive line belongs.

For example, when the address of the selected memory cell M-sel falls within the range of 1 to 1000, which is the address 1000 (Near) in this example, the address of the selected memory cell M-sel belongs to the first block B1.

In this case, the selection control circuit 17 constantly sets each of potentials Va1001, . . . Va4000 applied to one end of each of the Far unselected first conductive lines La1001, . . . La4000 to a voltage VUX1 (Fixed), for example, to $V_H-\alpha UX1$ while fixing an adjustment value to $\alpha UX1$ irrespective of the address (1 to 1000) of the selected memory cell M-sel.

It is to be noted that a value of $V_H-\alpha UX1$ can be set to, e.g., one of $V_H-\alpha 1, \ldots V_H-\alpha 1000$.

Further, when the address of the selected memory cell M-sel falls within the range of 1001 to 2000, which is the address 2000 (Middle) in this example, the address of the selected memory cell M-sel belongs to the second block B2.

In this case, the control circuit 17 constantly sets each of potentials Va2001, . . . Va4000 applied to one end of each of the Far unselected first conductive lines La2001, . . . La4000 to a voltage VUX2 (Fixed), for example, to $V_H-\alpha UX2$ while fixing an adjustment value to $\alpha UX2$ irrespective of the address (1001 to 2000) regardless of the selected memory cell M-sel.

It is to be noted that a value of $V_H-\alpha UX2$ can be set to, e.g., one of $V_H-\alpha 1001, V_H-\alpha 2000$.

Thereafter, the control circuit 17 likewise configures the setting when the address of the selected memory cell M-sel falls within the range of 2001 to 3000 and the range of 3001 to 4000.

Thus, the relationship between the address of the selected memory cell M-sel, the potentials in the unselected first conductive lines, and the adjustment values (the DRb side and the opposite side thereof) is collectively shown in FIG. 11. A table shown in FIG. 11 is stored as, e.g., the LUT in a memory portion 18 depicted in FIG. 6.

According to the second embodiment, since the adjustment value of the potential applied to one end of each of the unselected first conductive lines is determined in accordance with the position (the address) of the selected first conductive line, i.e., the position (the address) of the selected memory cell M-sel, each leak current (the sneak current) in the cross-point type memory cell array can be suppressed, and a low-consumption current can be achieved.

Additionally, when the Far unselected first conductive lines have the same value in a fixed range, operation parameters can be reduced. As a result, the operation can be simplified.

(3) Third Embodiment

Figure 12:
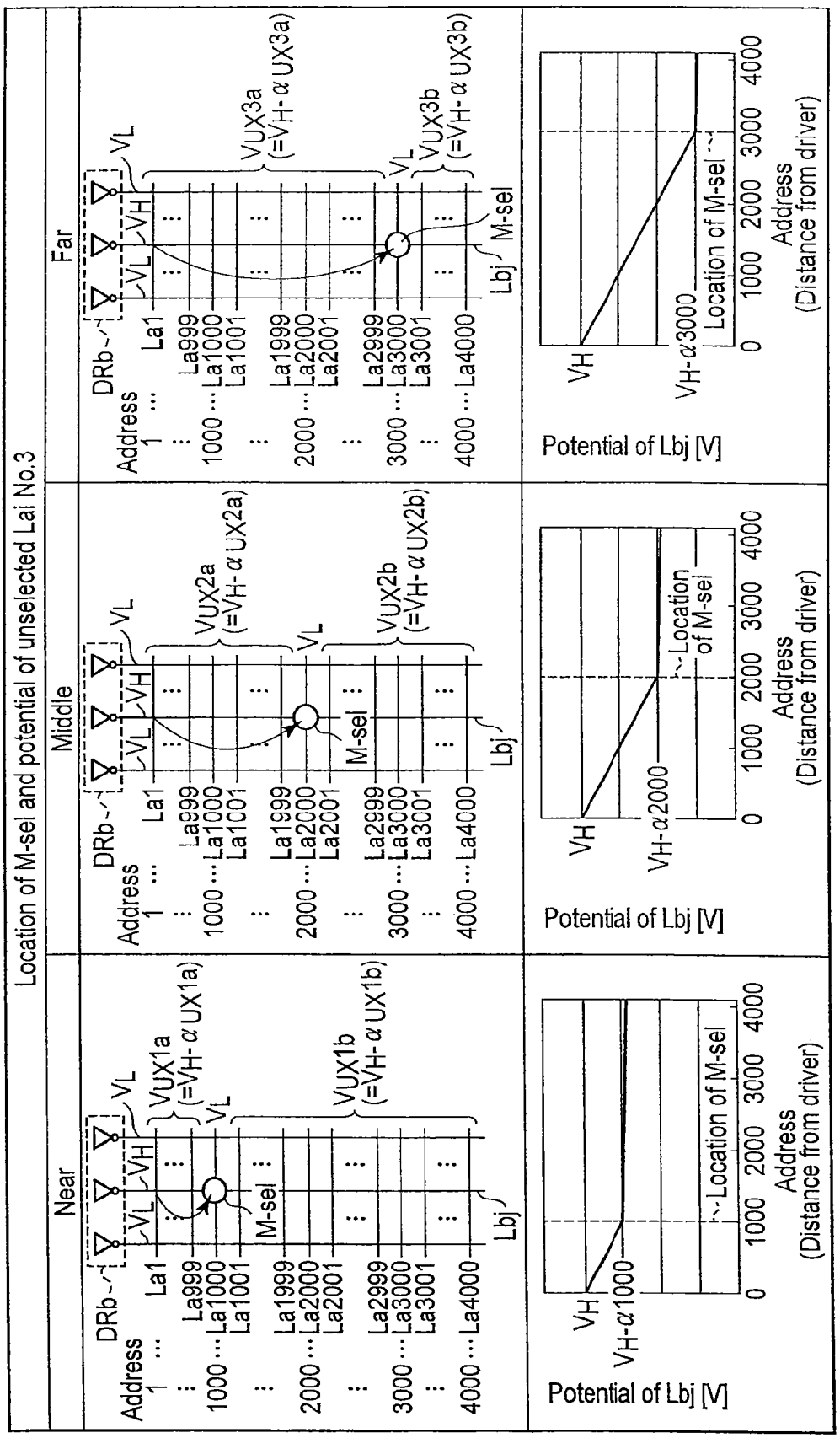
FIG. 12 is an example of a view showing an example of potentials applied to unselected first conductive lines.

FIG. 12 shows a third embodiment that determines potentials in unselected first conductive lines.

The third embodiment is a modification of the second embodiment.

As compared with the second embodiment, this example is characterized in how to determine an adjustment value of a potential that is applied to one end of each of unselected first conductive lines (Near unselected first conductive lines) placed on an inverter (a driver) DRb side of a selected memory cell M-sel. Other points are the same as those in the second embodiment, thereby omitting a detailed description thereof.

In this example, the first conductive lines are likewise classified into blocks. Since a classification method is the same as that in the second embodiment, a description thereof will be omitted here.

The control circuit 17 sets an adjustment value of a potential applied to one end of each of Near unselected first conductive lines to a common value (the same potential) in a block to which an address of a selected memory cell M-sel, i.e., an address of a selected first conductive line belongs.

For example, when the address of the selected memory cell M-sel falls within the range of 1 to 1000, which is the address 1000 (Near) in this example, the address of the selected memory cell M-sel belongs to the first block B1.

In this case, the control circuit 17 constantly sets each of potentials Va1, . . . Va999 applied to one end of each of the Near unselected first conductive lines La1, . . . La999 to a voltage VUX1a (Fixed), for example, to $V_H-\alpha UX1a$ while fixing an adjustment value to $\alpha UX1a$ irrespective of the address (1 to 1000) of the selected memory cell M-sel.

It is to be noted that a value of $V_H-\alpha UX1a$ can be set to, e.g., one of $V_H-\alpha 1, \ldots V_H-\alpha 1000$.

Like the second embodiment, the control circuit 17 constantly sets each of potentials Va1001, . . . Va4000 applied to one end of each of the Far unselected first conductive lines La1001, . . . La4000 to a voltage VUX2 (Fixed), for example, to $V_H-\alpha UX1b$ while fixing an adjustment value to $\alpha UX1b$ irrespective of the address (1 to 1000) of the selected memory cell M-sel.

Furthermore, when the address of the selected memory cell M-sel falls within the range of 1001 to 2000, which is the address 1000 (Middle) in this example, the address of the selected memory cell M-sel belongs to the second block B2.

In this case, the selection control circuit 17 constantly sets each of potentials Va1, . . . Va1999 applied to one end of each of the Near unselected first conductive lines La1, . . . La1999 to a voltage VUX2a (Fixed), for example, to $V_H-\alpha UX2a$ while fixing an adjustment value to αUX2a irrespective of the address (1001 to 2000) of the selected memory cell M-sel.

It is to be noted that a value of $V_H$–αUX2a can be set to, e.g., one of $V_H$–α1001, ... $V_H$–α2000.

Each of potentials Va2001, ... Va4000 applied to one end of each of the Far unselected first conductive lines La2001, ... La4000 is set to an adjustment value VUX2b (Fixed), for example, to $V_H$–αUX2b irrespective of the address (1001 to 2000) of the selected memory cell M-sel.

Thereafter, the control circuit 17 likewise configures the setting when the address of the selected memory cell M-sel falls within the range of 2001 to 3000 and the range of 3001 to 4000. Thus, the relationship between the address of the selected memory cell M-sel and the adjustment values of the potentials in the unselected first conductive lines (the DRb side and the opposite side thereof) is collectively shown in FIG. 13. A table shown in FIG. 13 is stored as, e.g., the LUT in the memory portion 18 depicted in FIG. 6.

Figure 13:
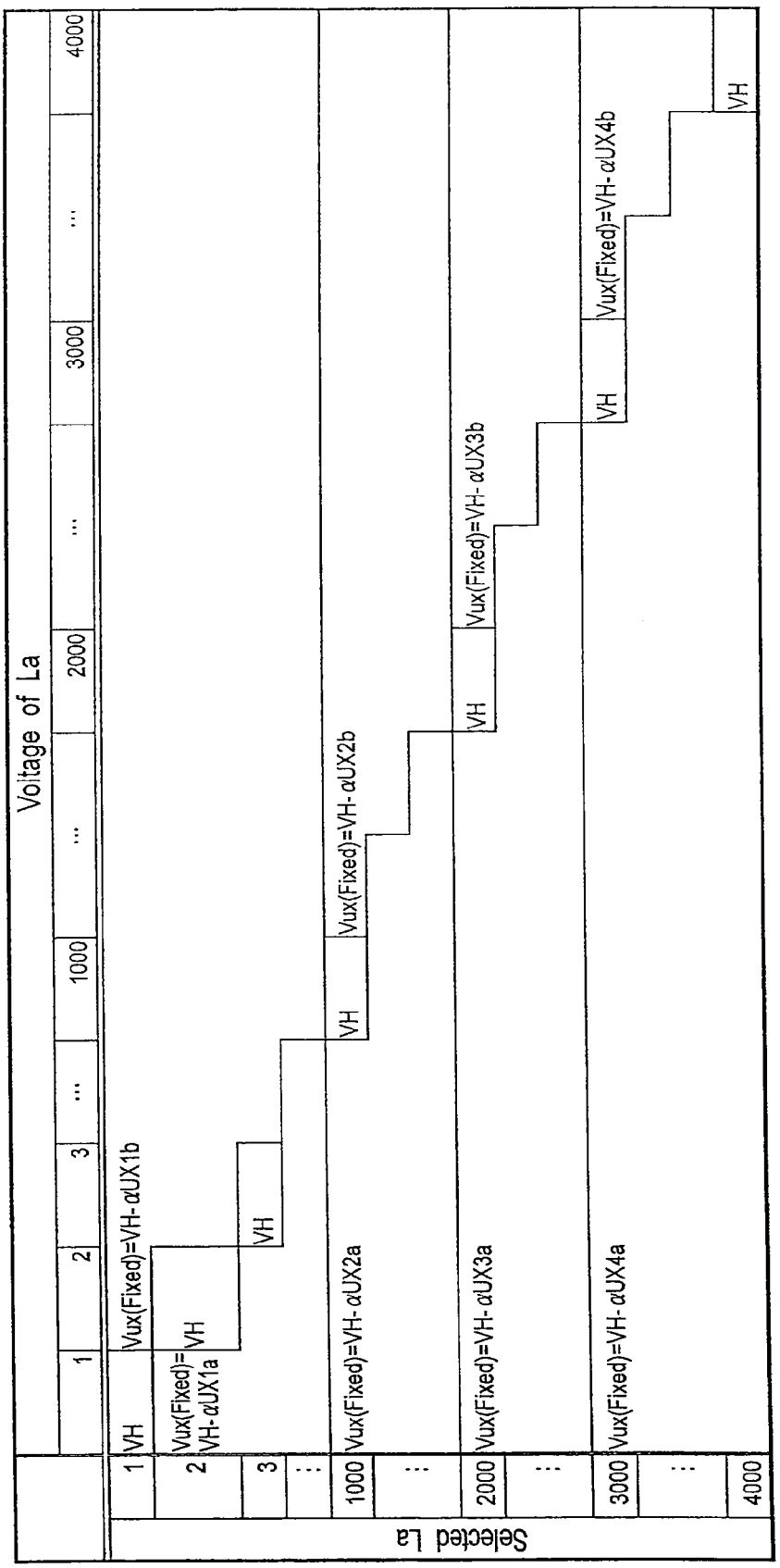
FIG. 13 is an example of a view showing a relationship between an address of a selected memory cell and potentials in unselected first conductive lines.

Furthermore, in FIG. 13, VUX1a and VUX1b may have the same value or may have different values. This can be likewise applied to: VUX2a and VUX2b; VUX3a and VUX3b; and VUX4a and VUX4b.

According to the third embodiment, since the potential applied to one end of each of the unselected first conductive lines and the adjustment value are determined in accordance with the position (the address) of the selected first conductive line, i.e., the position (the address) of the selected memory cell M-sel, each leak current (the sneak current) in the cross-point type memory cell array can be suppressed, and a low-consumption current can be attained.

Moreover, when the unselected conductive lines closer to the inverter DRb side are simply allowed to have the same value, operation parameters can be reduced. As a result, the operation can be simplified. Voltages of the Far unselected first conductive lines can be the same as those in the first embodiment.

(4) Fourth Embodiment

Figure 14:
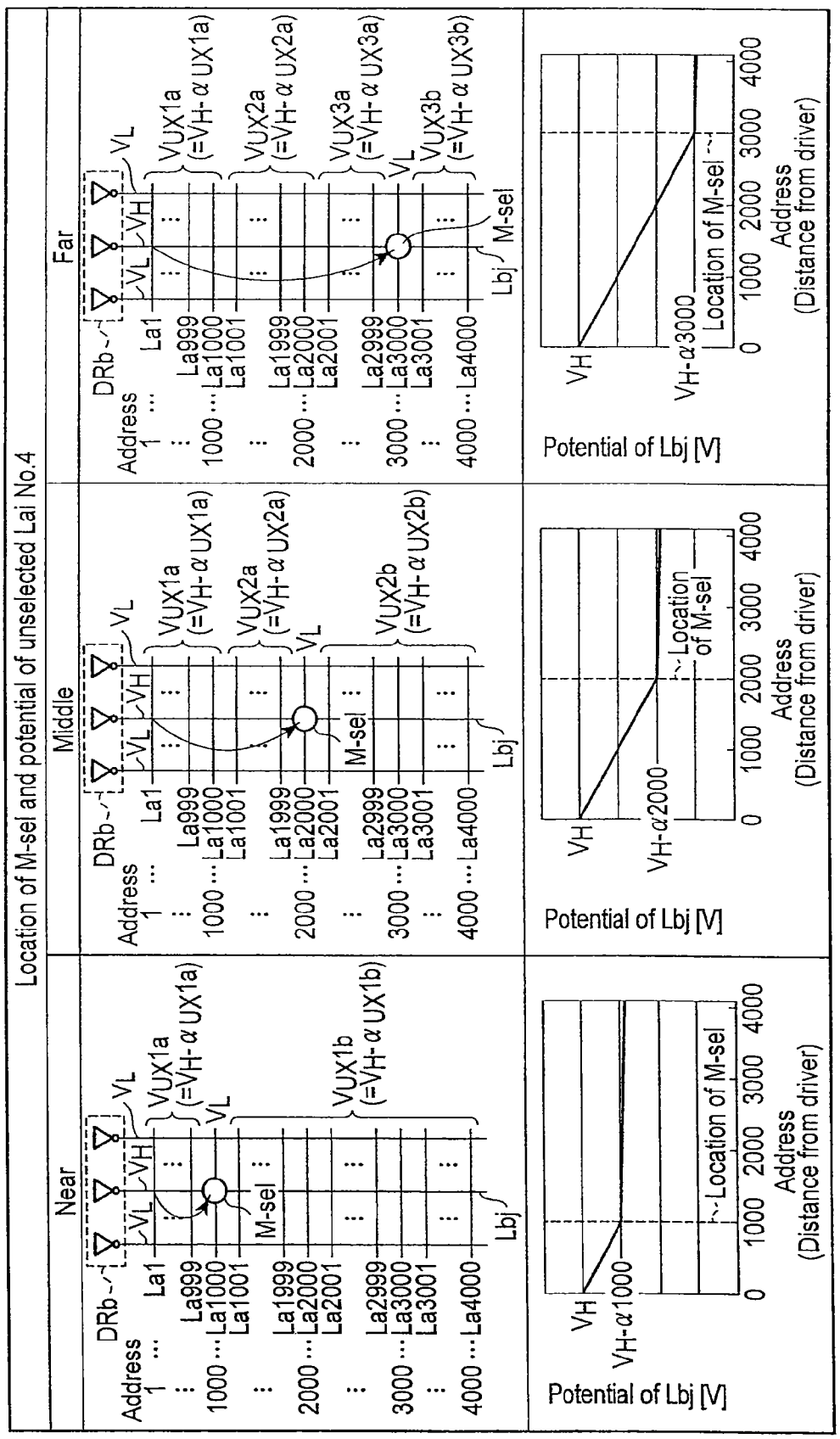
FIG. 14 is an example of a view showing an example of potentials applied to unselected first conductive lines.
Figure 17:
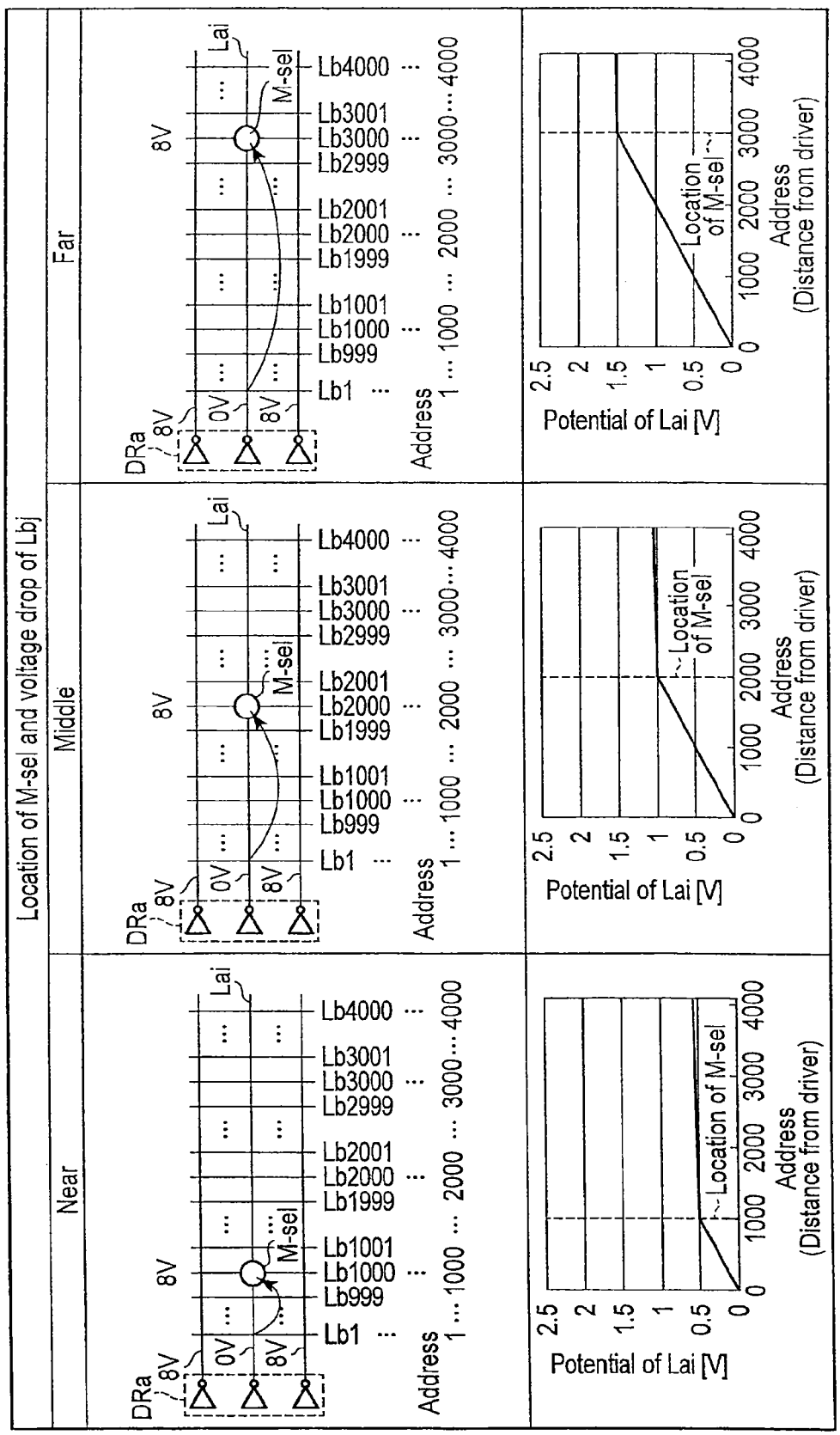
FIG. 17 is an example of a view showing relationship between a position of a selected memory cell and a voltage drop.

FIG. 14 shows a fourth embodiment that determines potentials in unselected first conductive lines.

The fourth embodiment is a modification of the third embodiment.

As compared with the third embodiment, this example is characterized in how to determine a potential (an adjustment value) applied to one end of each of unselected first conductive lines (Near unselected first conductive lines) placed on an inverter (a driver) DRb side of a selected memory cell M-sel. Other points are the same as those in the third embodiment, and hence a detailed description thereof will be omitted.

In this example, an adjustment value of a potential applied to one end of each of the Near unselected first conductive lines is determined in accordance with each block. That is, although the potentials (the adjustment values) applied to ends of the unselected first conductive lines on one side in the same block are the same, the potentials (the adjustment values) applied to ends of the unselected first conductive lines on one side in different blocks are different from each other.

For example, when an address of the selected memory cell M-sel is in the range of 1 to 1000, which is an address 1000 (Near) in this example, the address of the selected memory cell M-sel belongs to a first block B1.

In this case, the Near unselected first conductive lines La1, ... La999 all belong to the first block B1.

Therefore, a control circuit 17 constantly sets potentials Va1, ... Va999 applied to one end of each of the Near unselected first conductive lines La1, ... La999 to a voltage VUX1a (Fixed) irrespective of the address (1 to 1000) of the selected memory cell M-sel.

Additionally, when the address of the selected memory cell M-sel is in the range of 1001 to 2000, which is an address 2000 (Middle) in this example, the address of the selected memory cell M-sel belongs to a second block B2.

In this case, of the Near unselected first conductive lines La1, ... La1999, the first conductive lines La1, ... La1000 belong to the first block B1, and the first conductive lines La1001, ... La1999 belong to the second block B2.

Therefore, the control circuit 17 constantly sets the potentials Va1, ... Va1000 applied to one end of each of the first conductive lines La, ... La1000 in the first block B1 in the Near unselected first conductive lines La1, ... La1999 to the voltage VUX1a (Fixed) irrespective of the address (1001 to 2000) of the selected memory cell M-sel.

Further, the control circuit 17 constantly sets the potentials Va1001, ... Va1999 applied to one end of each of the first conductive lines La1001, ... La1999 in the second block B2 in the Near unselected first conductive lines La1, ... La1999 to a voltage VUX2a (Fixed) irrespective of the address (1001 to 2000) of the selected memory cell M-sel.

Thereafter, the control circuit 17 likewise configures the setting when the address of the selected memory cell M-sel falls within the range of 2001 to 3000 and the range of 3001 to 4000. It is to be noted that the control circuit 17 sets voltages (adjustment values) of the Far unselected first conductive lines to be equal to those in the third embodiment. Furthermore, the control circuit 17 can set the voltages (the adjustment values) of the Far unselected first conductive lines to be equal to those in the second or first embodiment.

Thus, the relationship between the address of the selected memory cell M-sel and the adjustment values of the potentials in the unselected first conductive lines (the DRb side and the opposite side thereof) is collectively shown in FIG. 15. A table shown in FIG. 15 is stored as an LUT in, e.g., the memory portion 18 in FIG. 6.

According to the fourth embodiment, since the potential (the adjustment value) applied to one end of each of the unselected first conductive lines is determined in accordance with the position (the address) of the selected first conductive line, i.e., the position (the address) of the selected memory cell M-sel, each leak current (a sneak current) in the cross-point type memory cell array can be suppressed, and a low-consumption current can be attained.

Moreover, in each of the unselected conductive lines close to the inverter DRb side, an optimum value differs depending on a potential drop. However, in case of adjusting voltages with respect to all the first conductive lines, an operation becomes complicated, and a circuit area increases. Therefore, the unselected first conductive lines close to the inverter DRb side are divided into fixed ranges (blocks), and these lines are set to the same adjustment value in accordance with each block, thereby reducing operation parameters. As a result, the operation can be simplified.

4. SECOND TECHNOLOGICAL CONCEPT

The first technological concept is characterized in that attention is turned to a voltage drop of a selected second conductive line to which a high potential $V_H$ is applied at one end thereof and each potential applied to one end of each of unselected first conductive lines is changed in accordance with a position (an address) of the selected memory cell.

On the other hand, the second technological concept is characterized in that attention is turned to a voltage drop of a selected first conductive line to which a low potential $V_L$ is applied at one end thereof (a voltage drop from an intermediate point of the selected first conductive line (a position to which a selected memory cell is connected) to one end of the first conductive line) and each potential applied to one end of each of unselected second conductive lines is changed in accordance with a position of the selected memory cell, i.e., a position (an address) of the selected second conductive line.

Figure 18:
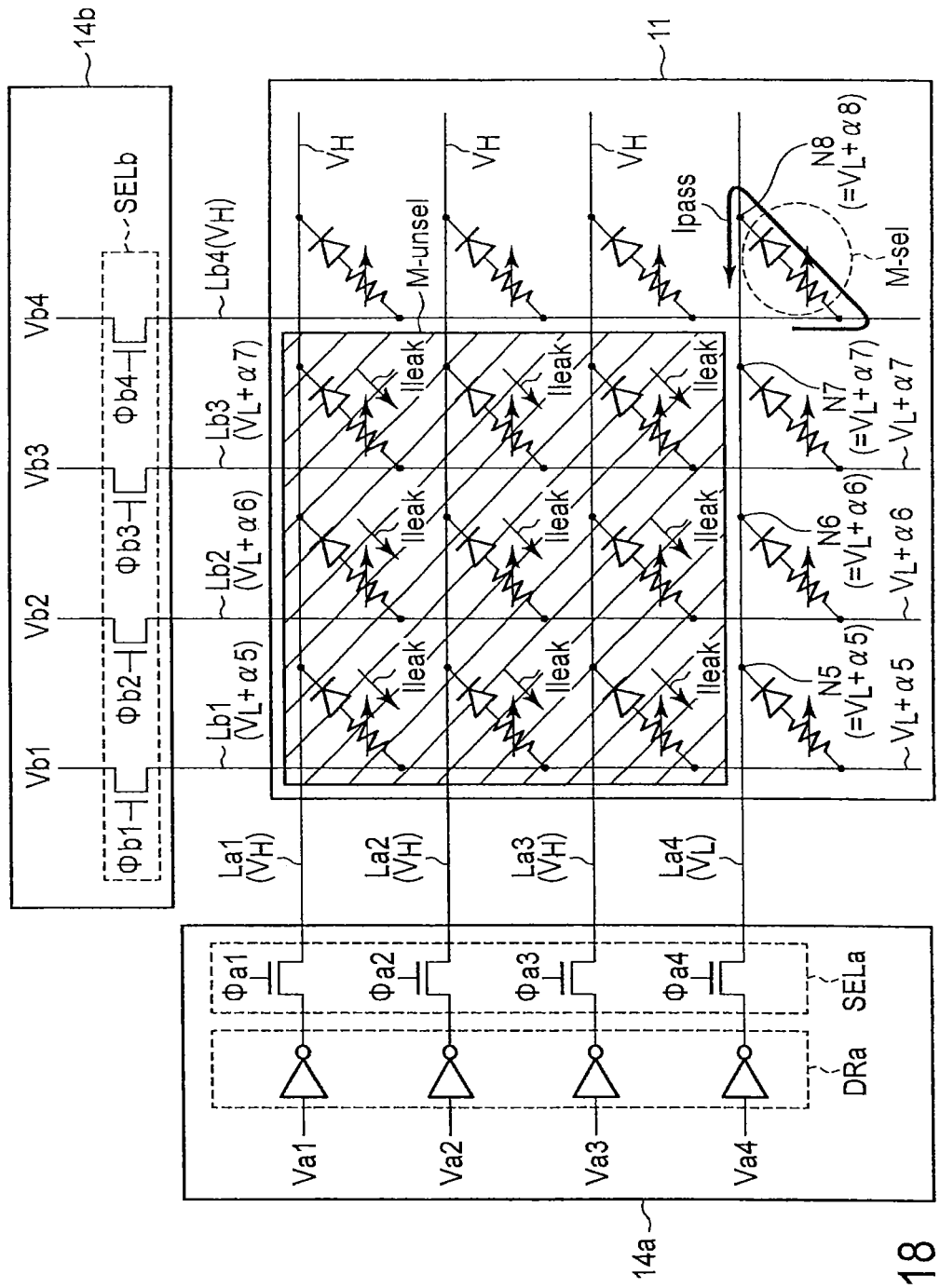
FIG. 18 is an example of a view showing a resistance change memory that realizes a second technological concept.

FIG. 18 shows a resistance change memory that realizes the second technological concept.

In this drawing, like reference numerals denote elements equal to those in FIG. 6 and FIG. 7, thereby omitting a detailed description thereof.

Structural characteristics of this resistance change memory lie in that an address signal indicative of a position (an address) of a selected memory cell M-sel (an address signal that designates a selected second conductive line Lb4) is input to a control circuit 17, potentials Vb1, . . . Vb2, and Vab which are output from a potential generating circuit 15 and applied to one end of each of unselected second conductive lines Lb1, . . . Lb2, and Lb3 are set to voltages associated with the address of the selected memory cell M-sel, and adjustment values of the potentials Vb1, Vb2, and Vb3 applied to one end of each of the unselected second conductive lines Lb1, . . . Lb2, and Lb3 are determined based on an LUT (Look up table) in a memory portion 18.

Additionally, since each of the potentials Vb1, Vb2, and Vb3 set to the adjustment values in accordance with the address of the selected memory cell M-sel is applied to one end of each of the unselected second conductive lines Lb1, . . . Lb2, and Lb3, an inverter DRb in a second decoder/driver 14b can be omitted. That is, the control circuit 17 can apply each of the potentials Vb1, . . . Vb2, Vb3, and Vb4 to one end of each of the unselected second conductive lines Lb1, . . . Lb2, Lb3, and Lb4 through a selection transistor SELb.

In the second technological concept, at the time of executing a write operation or a read operation with respect to the selected memory cell M-sel, a potential applied to one end of each of the unselected second conductive lines Lb1, . . . Lb2, and Lb3 is set to an adjustment value based on an address signal that designates the selected memory cell M-sel (an address signal that designates the selected second conductive line Lb4). Voltage drops are collectively shown in Table 4.

TABLE 4

| Voltage drop of La4 | |
|---|---|
| Node | Voltage |
| N5 | $V_L + \alpha 5$ |
| N6 | $V_L + \alpha 6$ |
| N7 | $V_L + \alpha 7$ |
| N8 | $V_L + \alpha 8$ |

However, La4 in Table 4 corresponds to the first conductive line La4 in FIG. 18, N5 to N8 in Table 4 correspond to nodes N5 to N8 of the first conductive line La4. Further, $V_L$ in Table 4 represents a potential (e.g., 0 V) applied to one end of the first conductive line La4. Here, α5, α6, and α7 are set values (offset values) from a conventional value $V_L$ (e.g., a ground potential Vss). Furthermore, assuming that the voltage drop in the selected second conductive line La4 can be approximated from one end of the selected first conductive line La4 on the driver DRa side to the position of the selected memory cell M-sel by using a linear function, the offset values α5, α6, and α7 have a relationship of α5<α6<α7.

Therefore, paying attention to a voltage drop in a selected first conductive line Lai, potentials in unselected second conductive lines do not have to be uniformed to a fixed potential $V_L$, e.g., the ground potential Vss, and a voltage or an adjustment value can be changed in accordance with, e.g., a position of the selected memory cell M-sel, i.e., an address of the selected second conductive line.

Further, when potentials in the unselected second conductive lines are changed to adjustment values in accordance with an address of the selected memory cell M-sel, each leak current in the unselected memory cells can be reduced, a sneak current can be suppressed, and a reduction in consumption current can be achieved.

It is to be noted that the voltage drop in the selected first conductive line Lai is intricately changed due to the position of the selected memory cell M-sel (which is the address of the selected first conducive line Lai in particular), an influence from the unselected second conductive lines (capacitance coupling), and the like.

That is, it may be preferable to approximate the voltage drop in the selected first conductive line Lai from one end of the selected first conductive line Lai on the driver DRa side to the position (the address) of the selected memory cell M-sel by using a quadratic function, a cubic function, or an nth-order function (n is a natural number equal to or higher than 2) in some cases.

For example, the potential Vb1 applied to one end of the unselected second conductive line Lb1 is set to ($V_L$+α5), the potential Vb2 applied to one end of the unselected second conductive line Lb2 is set to ($V_L$+α6), and the potential Vb3 applied to one end of the selected second conductive line Lb3 is set to ($V_L$+α7).

On the other hand, the potential Va4 applied to one end of the selected first conductive line La4 is set to $V_L$ (e.g., a ground potential Vss), and the potential Vb4 applied to one end of the selected second conductive line Lb4 is set to $V_H$ (e.g., a power supply potential Vdd).

Therefore, a forward bias is applied to a diode in the selected memory cell M-sel, and a predetermined current Ipass flows through the resistance change element in the selected memory cell M-sel.

Further, the potentials Va1, . . . Va2, and Va3 applied to one end of each of the unselected first conductive lines La1, . . . La2, and La3 are set to $V_H$ (e.g., the power supply potential Vdd).

Therefore, since the bias is not applied to the unselected memory cells connected to the selected second conductive line Lb4 (potentials at both ends of each unselected memory cell are both $V_H$), erroneous writing is avoided.

Likewise, since the bias is not applied to the unselected memory cells connected to the selected first conductive line La4, erroneous writing is avoided.

Specifically, a potential in the unselected second conductive line Lb1 and a potential in the node N5 of the selected first conductive line La4 are both ($V_L$−α5), a potential in the unselected second conductive line Lb2 and a potential in the node N6 of the selected first conductive line La4 are both ($V_L$−α6), and a potential in the unselected second conductive line Lb3 and a potential in the node N7 of the selected first conductive line La4 are both ($V_L$−α7).

The bias relationship is collectively shown in Table 5.

TABLE 5

| Write/Read (Set/Reset) of M-sel | | | |
|---|---|---|---|
| La1 | $V_H$ | Lb1 | $V_L + \alpha 5$ |
| La2 | $V_H$ | Lb2 | $V_L + \alpha 6$ |
| La3 | $V_H$ | Lb3 | $V_L + \alpha 7$ |
| La4 | $V_L$ | Lb4 | $V_H$ |

As described above, according to the second technological concept, when attention is turned to the voltage drop in the selected first conductive line La4, the potentials Vb1, ... Vb2, and Vb3 applied to one end of each of the unselected second conductive lines Lb1, Lb2, and Lb3 can be increased to be higher than the conventional value $V_L$ (e.g., the ground potential Vss).

As a result, in the unselected memory cells connected between the unselected first conductive lines La1, ... La2, and La3 and the unselected second conductive lines Lb1, ... Lb2, and Lb3 (the memory cells in the hatched region), a backward bias applied to each diode becomes smaller than that in the conventional example.

Therefore, the leak currents Ileak generated in the unselected memory cells also become small.

As described above, when the potentials (the adjustment values) in the unselected second conductive lines Lb1, ... Lb2, and Lb3 are changed in accordance with the address of the selected memory cell M-sel, the leak currents in the unselected memory cells can be reduced, the sneak current can be suppressed, and a consumption current can be decreased.

5. EMBODIMENTS OF SECOND TECHNOLOGICAL CONCEPT

(1) First Embodiment

Figure 19:
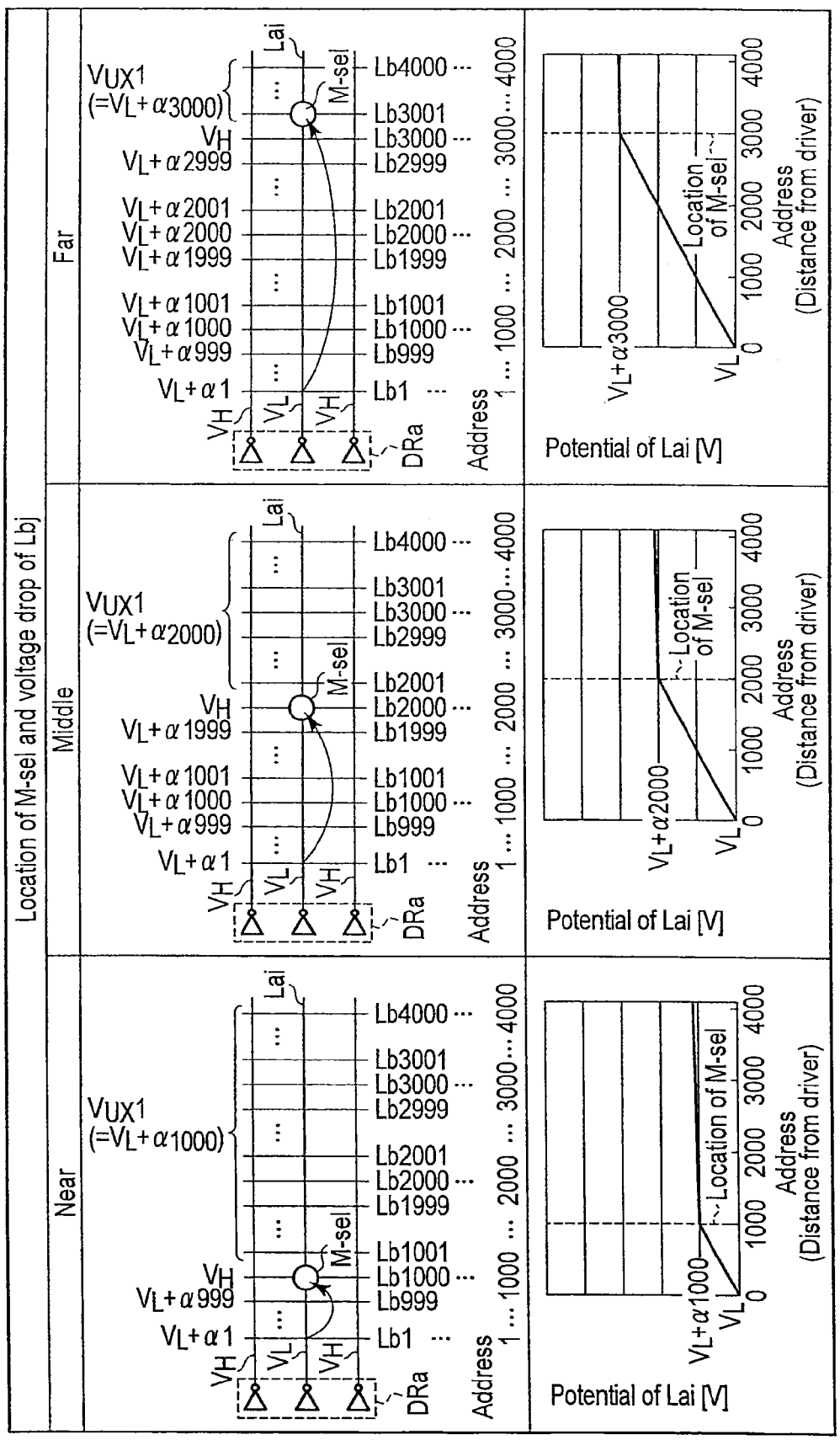
FIG. 19 is an example of a view showing an example of potentials applied to unselected second conductive lines.
Figure 20:
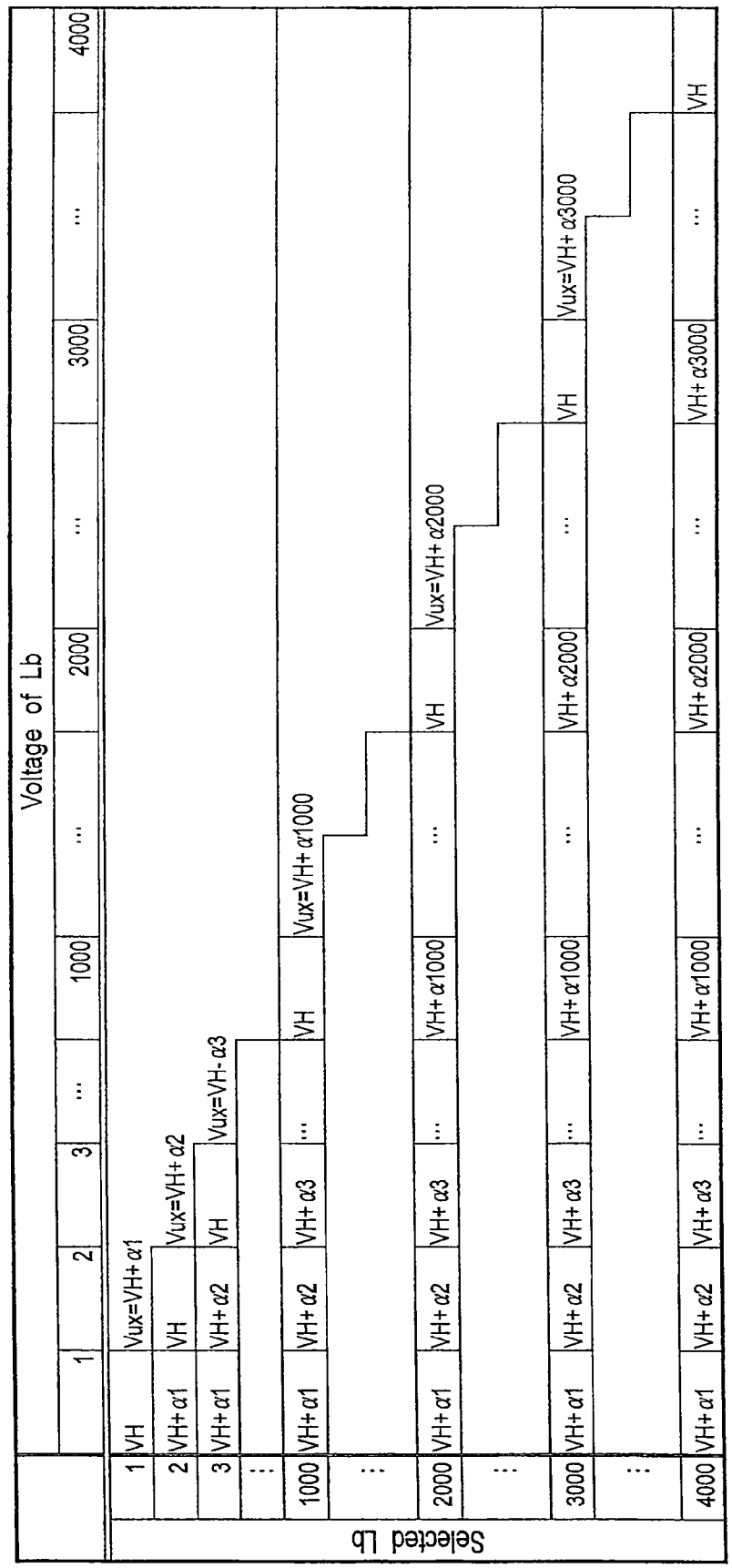
FIG. 20 is an example of a view showing a relationship between an address of a selected memory cell and potentials in unselected second conductive lines.

FIG. 19 and FIG. 20 show a first embodiment that determines potentials in unselected second conductive lines.

In this example, a high potential $V_H$ is applied to one end of a selected second conductive line and one end of each of unselected first conductive lines, and a low potential VL is applied to one end of the selected first conductive line Lai. Furthermore, a potential (an adjustment value) applied to one end of each of unselected second conductive lines is determined in accordance with a position (an address) of the selected second conductive line, i.e., a position (an address) of the selected memory cell M-sel.

In this example, addresses of the second conductive lines Lb1, ... Lb4000 (e.g., column addresses) are represented as 1 to 4000, respectively, but the present invention is not restricted thereto. The number of the second conductive lines (the number of the addresses) may be equal to or higher than or may be equal to or lower than these values.

Furthermore, the addresses of the second conductive lines Lb1, ... Lb4000 are assumed to sequentially increase from the inverter DRa side that drives the first conductive lines toward the opposite side thereof.

Additionally, in this example, the position of the selected second conductive line, i.e., the position of the selected memory cell M-sel is classified into three types, i.e., an address 1000 (Lb1000: Near), an address 2000 (Lb2000: Middle), and an address 3000 (Lb3000: Far), and these addresses will be explained.

In this example, first, a potential (an adjustment value) applied to one end of each of the unselected second conductive lines placed on the inverter (the driver) DRa side of the selected memory cell M-sel is set in accordance with each second conductive line.

For example, when the address of the selected memory cell M-sel is 1000 (Near), each of the potentials Vb1, ... Vb999 applied to one end of each of the unselected second conductive lines Lb1, ... Lb999 (Near unselected second conductive lines) placed on the inverter DRa side of the selected memory cell M-sel is set to each of $V_L-\alpha 1, V_L-\alpha 999$. However, each of $\alpha 1, ... \alpha 999$ is an adjustment value (an offset value) from a low potential $V_L$ (e.g., the ground potential Vss).

The adjustment values $\alpha 1, ... \alpha 999$ can be independently determined in accordance with each second conductive line.

For example, assuming that the voltage drop in the selected first conductive line Lai can be approximated from the position of the selected memory cell M-sel to one end of the inverter DRa side by using the linear function as shown in the drawing, there is a relationship of $\alpha 1 < ... < \alpha 999$.

Moreover, when the address of the selected memory cell M-sel is 2000 (Middle), the control circuit 17 sets each of the potentials Vb1, ... Vb1999 applied to one end of each of the Near unselected second conductive lines Lb1, ... Lb1999 to each of $V_L-\alpha 1, ... V_L-\alpha 1999$. However, each of $\alpha 1, ... \alpha 1999$ is an adjustment value from the low potential $V_L$ (e.g., the ground potential Vss).

The offset values $\alpha 1, ... \alpha 1999$ can be independently determined in accordance with each second conductive line.

For example, assuming that the voltage drop in the selected first conductive line Lai can be approximated from the position of the selected memory cell M-sel to one end of the inverter DRb side by using the linear function as shown in the drawing, there is a relationship of $\alpha 1 < ... < \alpha 1999$.

Additionally, when the address of the selected memory cell M-sel is 3000 (Far), the control circuit 17 sets each of the potentials Vb1, ... Vb2999 applied to one end of each of the Near unselected second conductive lines Lb1, ... Lb2999 to each of $V_L-\alpha 1, V_L-\alpha 2999$. However, each of $\alpha 1, ... \alpha 2999$ is an adjustment value from the low potential $V_L$ (e.g., the ground potential Vss).

The adjustment values $\alpha 1, ... \alpha 1999$ can be independently determined in accordance with each second conductive line.

For example, assuming that the voltage drop in the selected first conductive line Lai can be approximated from the position of the selected memory cell M-sel to one end of the inverter DRb side by using the linear function as shown in the drawing, there is a relationship of $\alpha 1 < ... < \alpha 2999$.

Then, a potential (an adjustment value) applied to one end of each of the unselected second conductive lines (the Far unselected second conductive lines) placed on the opposite side of the inverter (the driver) DRa side of the selected memory cell M-sel is set.

Although the potential applied to one end of each of the Far unselected second conductive lines is changed in accordance with the address of the selected memory cell M-sel, it is common (the same potential) in these unselected second conductive lines.

That is because, as shown in FIG. 19, the voltage drop in the selected first conductive line Lai is large on the inverter DRa side of the selected memory cell M-sel but the voltage drop in the selected first conductive line Lai is hardly observed on the opposite side of the inverter DRa side of the selected memory cell M-sel.

For example, when the address of the selected memory cell M-sel is 1000 (Near), the control circuit 17 sets each of the potentials Vb1001, ... Vb4000 applied to one end of the unselected second conductive lines Lb1001, ... Lb4000 placed on the opposite side of the inverter DRa side of the selected memory cell M-sel to a voltage VUX1, e.g., $V_L+\alpha 1000$ (a potential at an intermediate point of the selected first conductive line Lai at the position of the selected memory cell M-sel). However, the voltage VUX1 is not restricted to $V_L+\alpha 1000$, and any other value may be adopted.

Furthermore, when the address of the selected memory cell M-sel is 2000 (Middle), each of the potentials Vb2001, . . . Vb4000 applied to one end of each of the Far unselected second conductive lines Lb2001, . . . Lb4000 is set to a voltage VUX1, e.g., $V_L+\alpha 2000$ (a potential at an intermediate point of the selected first conductive line Lai at the position of the selected memory cell M-sel). However, the voltage VUX1 is not restricted to $V_L+\alpha 2000$, and any other value may be adopted.

Moreover, when the address of the selected memory cell M-sel is 3000 (Far), each of the potentials Vb3001, . . . Vb4000 applied to one end of each of the Far unselected second conductive lines Lb3001, . . . Lb4000 is set to a voltage VUX1, e.g., $V_L+\alpha 3000$ (a potential at an intermediate point of the selected first conductive line Lai at the position of the selected memory cell M-sel). However, the voltage VUX1 is not restricted to $V_L+\alpha 3000$, and any other value may be adopted.

According to the first embodiment, since the voltage (the adjustment value) of the potential applied to one end of each of the unselected second conductive lines is determined in accordance with the position (the address) of the selected second conductive line, i.e., the position (the address) of the selected memory cell M-sel, the leak currents (the sneak current) in the cross-point type memory cell array can be suppressed, and a low-consumption current can be attained.

(2) Second Embodiment

Figure 22:
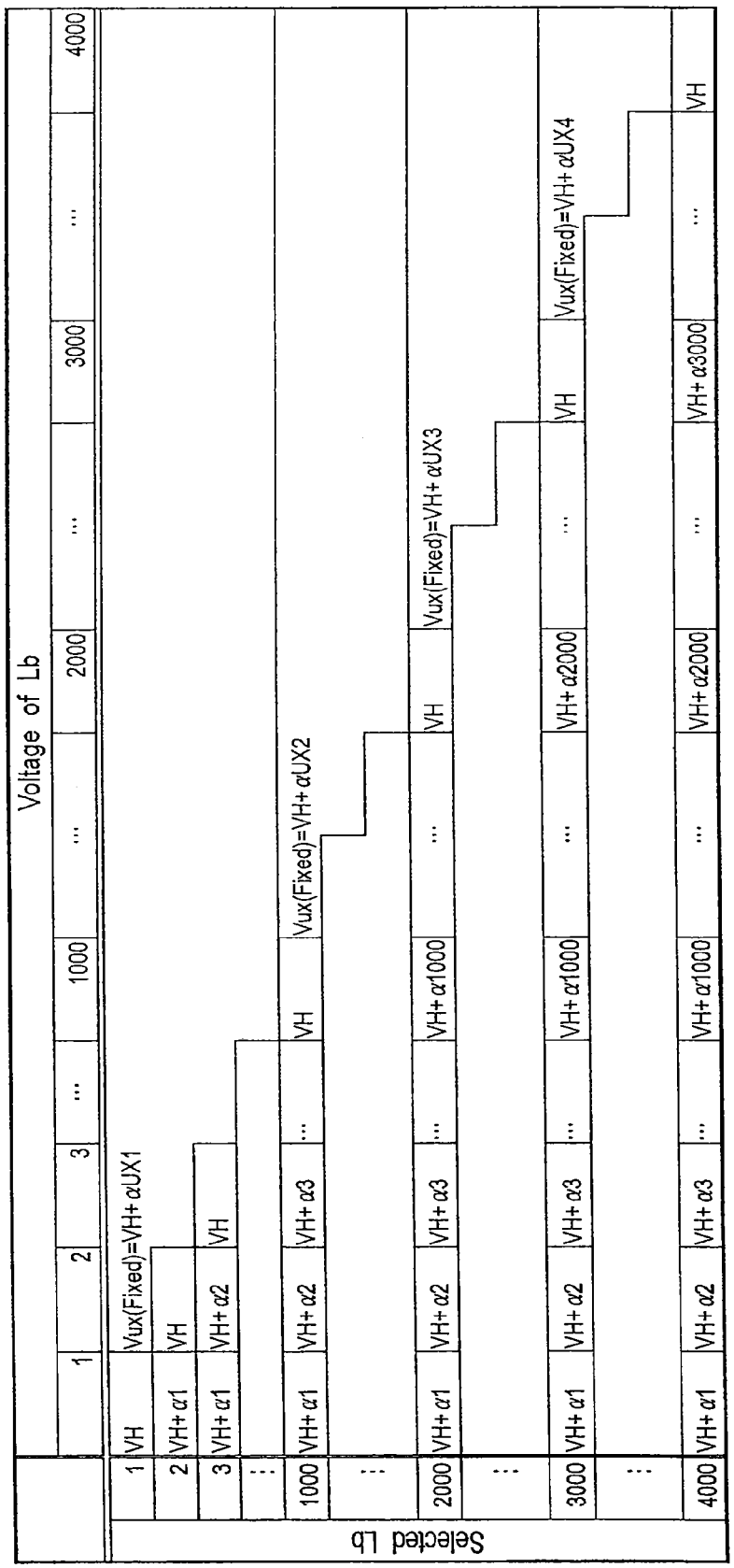
FIG. 22 is an example of a view showing an address of a selected memory cell and potentials in unselected second conductive lines.

FIG. 21 and FIG. 22 show a second embodiment that determines potentials in unselected second conductive lines.

The second embodiment is a modification of the first embodiment.

As compared with the first embodiment, this example is characterized in how to determine a potential (an adjustment value) that is applied to one end of each of unselected second conductive lines (Far unselected second conductive lines) placed on the opposite side of an inverter (a driver) DRa side of a selected memory cell M-sel. Other points are the same as those in the first embodiment, thereby omitting a detailed description thereof.

In this example, the second conductive lines are classified into blocks.

For example, the second conductive lines Lb1, . . . Lb1000 having addresses 1 to 1000 are classified into a first block B1, the second conductive lines Lb1001, . . . Lb2000 having addresses 1001 to 2000 are classified into a second block B2, the second conductive lines Lb2001, . . . Lb3000 having addresses 2001 to 3000 are classified into a third block B3, and the second conductive lines Lb3001, . . . Lb4000 having addresses 3001 to 4000 are classified into a fourth block B4.

Further, an adjustment value of a potential applied to one end of each of Far unselected second conductive lines to a common value (the same potential) in a block to which an address of the selected memory cell M-sel, i.e., an address of a selected second conductive line belongs.

For example, when the address of the selected memory cell M-sel falls within the range of 1 to 1000, which is the address 1000 (Near) in this example, the address of the selected memory cell M-sel belongs to the first block B1.

In this case, the control circuit 17 constantly sets each of potentials Vb1001, . . . Vb4000 applied to one end of each of the Far unselected second conductive lines Lb1001, . . . Lb4000 to a voltage VUX1 (Fixed), for example, $V_{HL}\alpha UX1$ irrespective of the address (1 to 1000) of the selected memory cell M-sel.

It is to be noted that a value of $V_L-\alpha UX1$ can be set to, e.g., one of $V_L-\alpha 1$, $V_L-\alpha 1000$.

Further, when the address of the selected memory cell M-sel falls within the range of 1001 to 2000, which is the address 2000 (Middle) in this example, the address of the selected memory cell M-sel belongs to the second block B2.

In this case, each of potentials Vb2001, . . . Vb4000 applied to one end of each of the Far unselected second conductive lines Lb2001, . . . Lb4000 is constantly set to a voltage VUX2 (Fixed), for example, $V_L-\alpha UX2$ irrespective of the address (1001 to 2000) of the selected memory cell M-sel.

It is to be noted that a value of $V_L-\alpha UX2$ can be set to, e.g., one of $V_L-\alpha 1001$, $V_L-\alpha 2000$. Thereafter, the control circuit 17 likewise configures the setting when the address of the selected memory cell M-sel falls within the range of 2001 to 3000 and the range of 3001 to 4000.

Thus, the relationship between the address of the selected memory cell M-sel and the potentials (the adjustment values) in the unselected second conductive lines (the DRa side and the opposite side thereof) is collectively shown in FIG. 22. A table shown in FIG. 22 is stored as, e.g., an LUT in a memory portion 18 depicted in FIG. 18.

According to the second embodiment, since the potential (the adjustment value) applied to one end of each of the unselected second conductive lines is determined in accordance with the position (the address) of the selected first conductive line, i.e., the position (the address) of the selected memory cell M-sel, each leak current (the sneak current) in the cross-point type memory cell array can be suppressed, and a low-consumption current can be achieved.

(3) Third Embodiment

Figure 23:
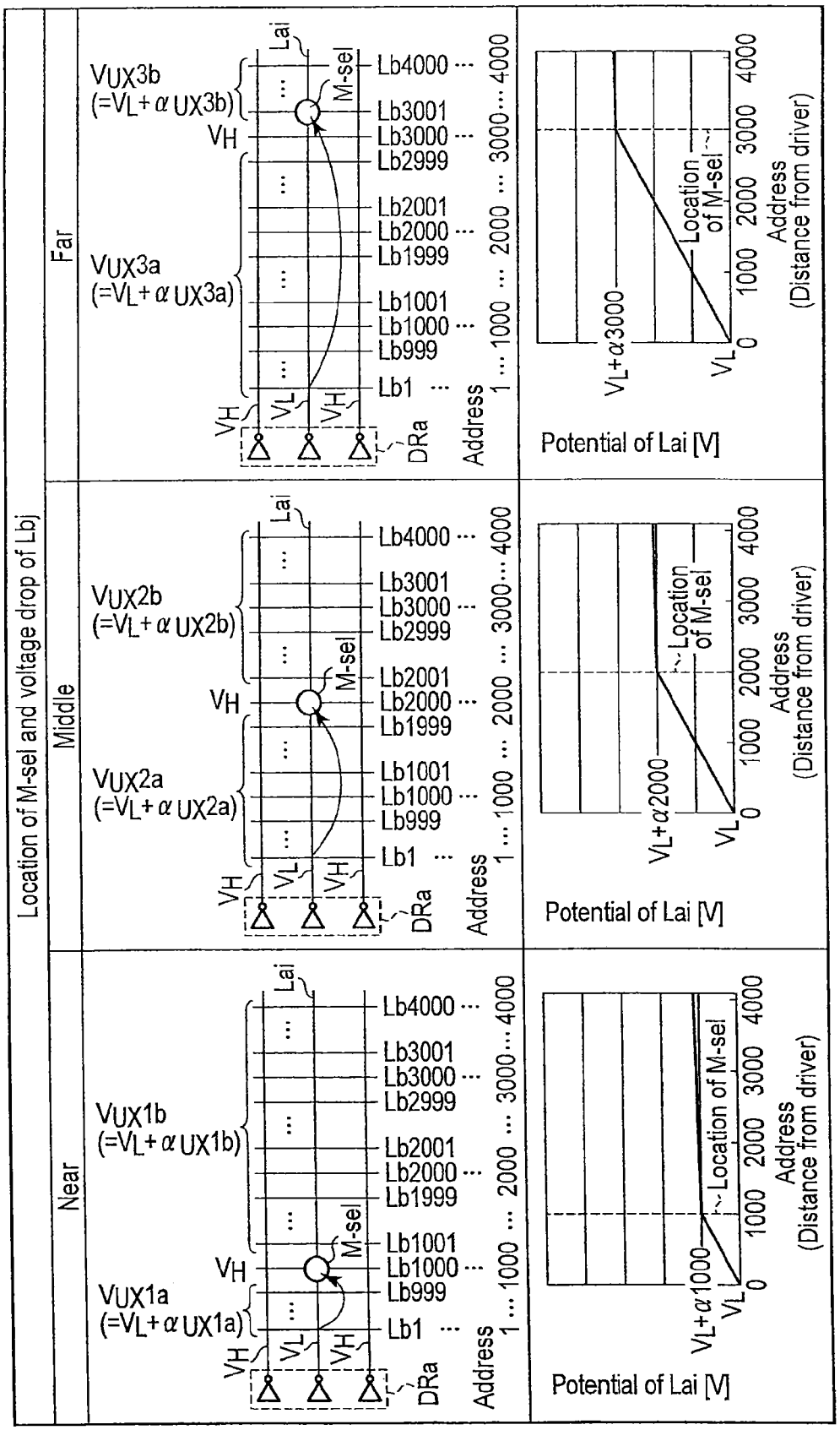
FIG. 23 is an example of a view showing an example of potentials applied to unselected second conductive lines.
Figure 24:
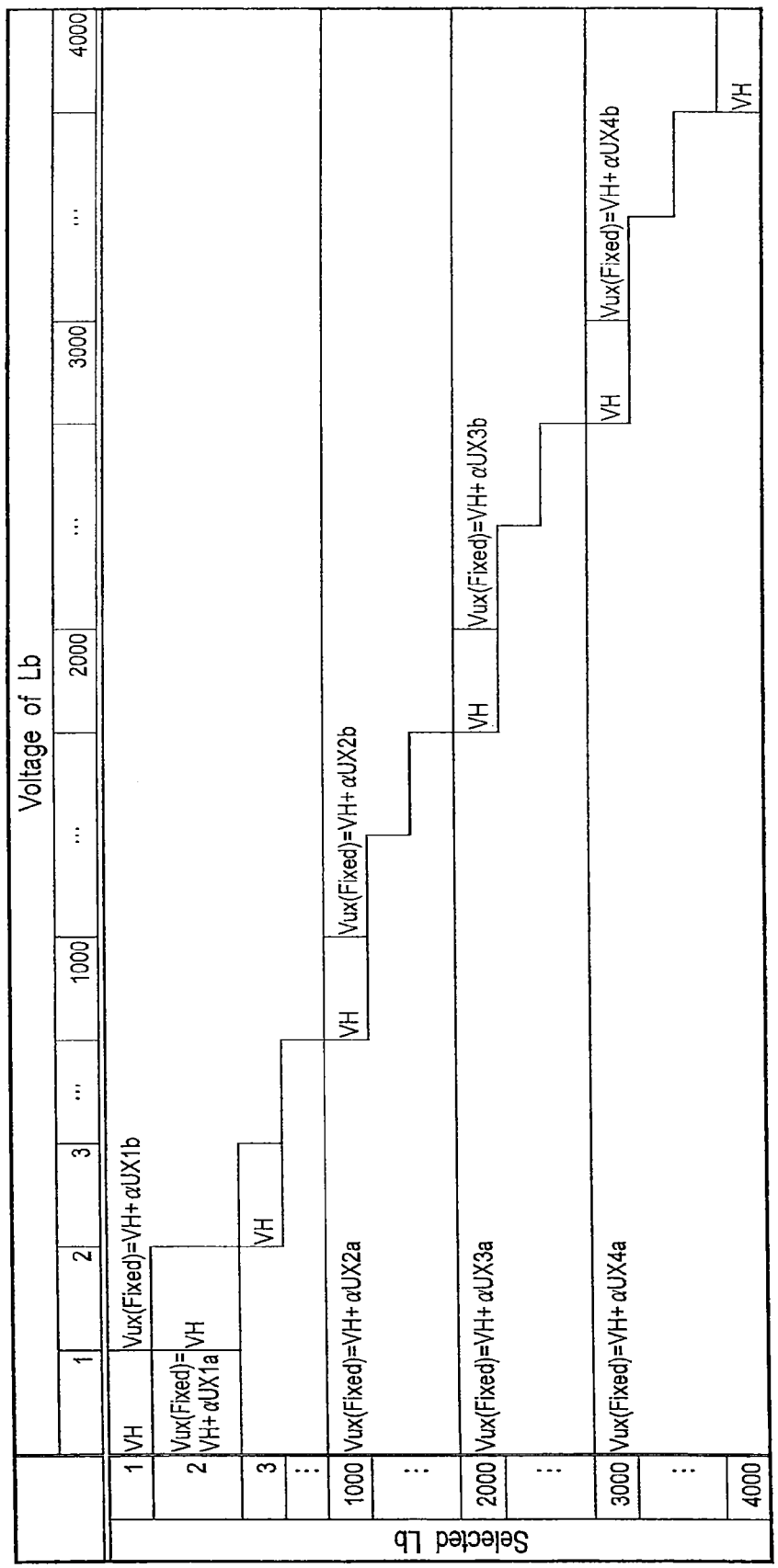
FIG. 24 is an example of a view showing a relationship between an address of a selected memory cell and potentials in unselected second conductive lines.

FIG. 23 and FIG. 24 show a third embodiment that determines potentials in unselected second conductive lines.

The third embodiment is a modification of the second embodiment.

As compared with the second embodiment, this example is characterized in how to determine a potential (an adjustment value) that is applied to one end of each of unselected second conductive lines (Far unselected second conductive lines) placed on an inverter (a driver) DRa side of a selected memory cell M-sel. Other points are the same as those in the second embodiment, thereby omitting a detailed description thereof.

In this example, the second conductive lines are likewise classified into blocks. Since a classification method is the same as that in the second embodiment, a description thereof will be omitted here.

A potential (an adjustment value) applied to one end of each of unselected second conductive lines placed on the inverter DRa side of the selected memory cell M-sel is set a common value (the same potential) in a block to which an address of the selected memory cell M-sel, i.e., an address of a selected second conductive line belongs.

For example, when the address of the selected memory cell M-sel falls within the range of 1 to 1000, which is the address 1000 (Near) in this example, the address of the selected memory cell M-sel belongs to the first block B1.

In this case, each of potentials Vb1, . . . Vb999 applied to one end of each of the Near unselected second conductive lines Lb1, . . . Lb999 is constantly set to a voltage VUX1a (Fixed), for example, to $V_L-\alpha UX1a$ irrespective of the address (1 to 1000) of the selected memory cell M-sel.

It is to be noted that a value of $V_L-\alpha UX1a$ can be set to, e.g., one of $V_L-\alpha 1$, $V_L-\alpha 1000$.

Like the second embodiment, each of potentials Vb1001, . . . Vb4000 applied to one end of each of the unselected second conductive lines Lb1001, . . . Lb4000 placed on the opposite side of the inverter DRa side of the selected memory cell M-sel is constantly set to a voltage VUX1b (Fixed), for example, to $V_L-\alpha UX1b$ irrespective of the address (1 to 1000) irrespective of the address (1 to 1000) of the selected memory cell M-sel.

Furthermore, when the address of the selected memory cell M-sel falls within the range of 1001 to 2000, which is the address 1000 (Middle) in this example, the address of the selected memory cell M-sel belongs to the second block B2.

In this case, each of potentials Vb1, . . . Vb1999 applied to one end of each of the Near unselected second conductive lines Lb1, . . . Lb1999 is constantly set to an adjustment value VUX2a (Fixed), for example, to $V_L-\alpha UX2a$ irrespective of the address (1001 to 2000) of the selected memory cell M-sel.

It is to be noted that a value of $V_L-\alpha UX2a$ can be set to, e.g., one of $V_L-\alpha 1001$, $V_L-\alpha 2000$.

Each of potentials Vb2001, . . . Vb4000 applied to one end of each of the Far unselected first conductive lines Lb2001, . . . Lb4000 is set to an adjustment value VUX2b (Fixed), for example, to $V_L-\alpha UX2b$ irrespective of the address (1001 to 2000) of the selected memory cell M-sel. Furthermore, as the voltage applied to one end of each of the Far unselected second conductive lines, the control circuit 17 can adopt the same voltage in the first embodiment.

Moreover, the same setting is configured when the address of the selected memory cell M-sel falls within the range of 2001 to 3000 and the range of 3001 to 4000.

Thus, the relationship between the address of the selected memory cell M-sel and the adjustment values of the potentials in the unselected second conductive lines (the DRa side and the opposite side thereof) is collectively shown in FIG. 24. A table shown in FIG. 24 is stored as, e.g., the LUT in the memory portion 18 depicted in FIG. 18.

Furthermore, in FIG. 24, VUX1a and VUX1b may have the same value or may have different values. This can be likewise applied to: VUX2a and VUX2b; VUX3a and VUX3b; and VUX4a and VUX4b.

According to the third embodiment, since the potential (the adjustment value) applied to one end of each of the unselected second conductive lines is determined in accordance with the position (the address) of the selected second conductive line, i.e., the position (the address) of the selected memory cell M-sel, each leak current (the sneak current) in the cross-point type memory cell array can be suppressed, and a low-consumption current can be attained.

(4) Fourth Embodiment

Figure 25:
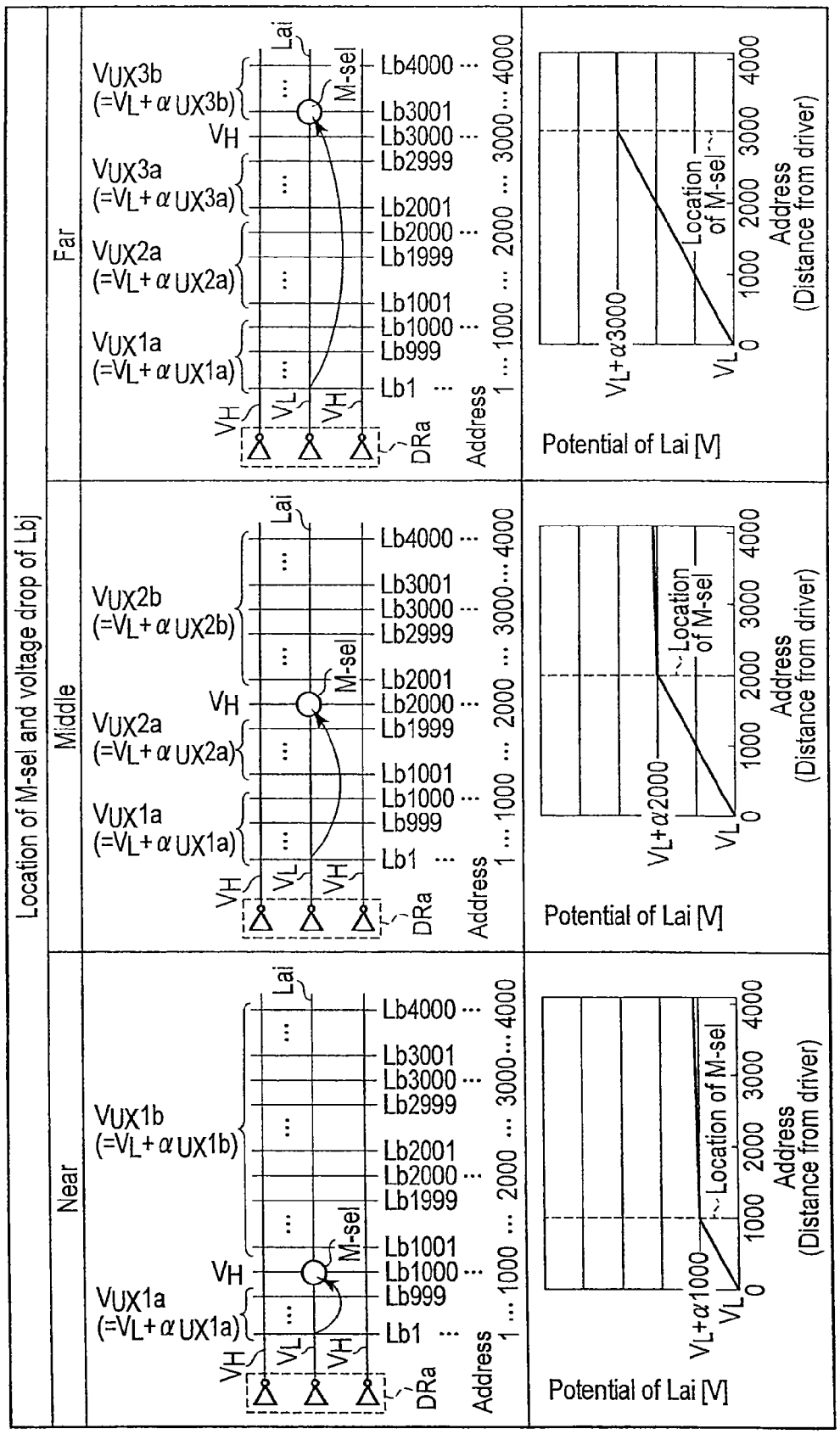
FIG. 25 is an example of a view showing an example of potentials applied to unselected second conductive lines.
Figure 26:
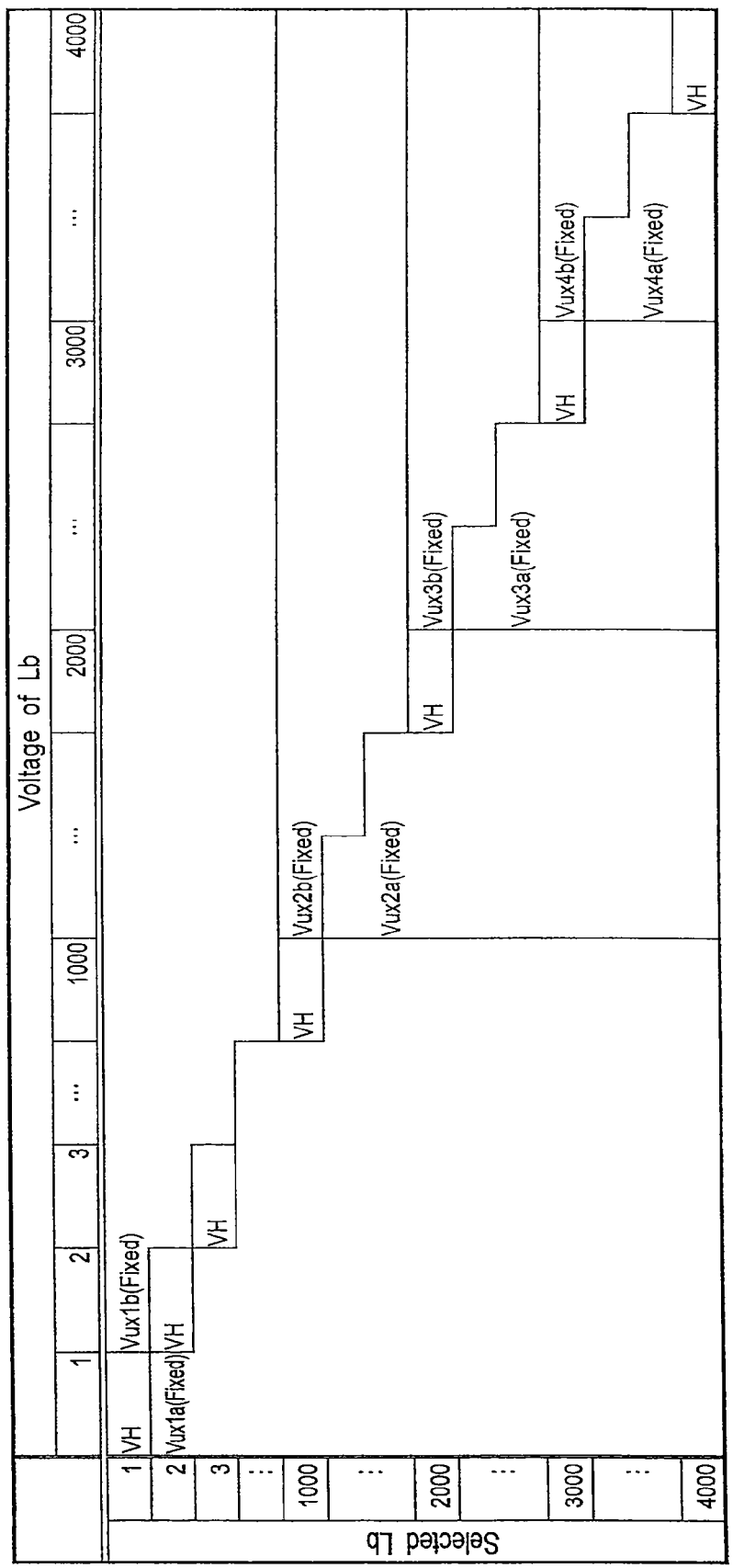
FIG. 26 is an example of a view showing a relationship between an address of a selected memory cell and potentials in unselected second conductive lines.
Figure 27:
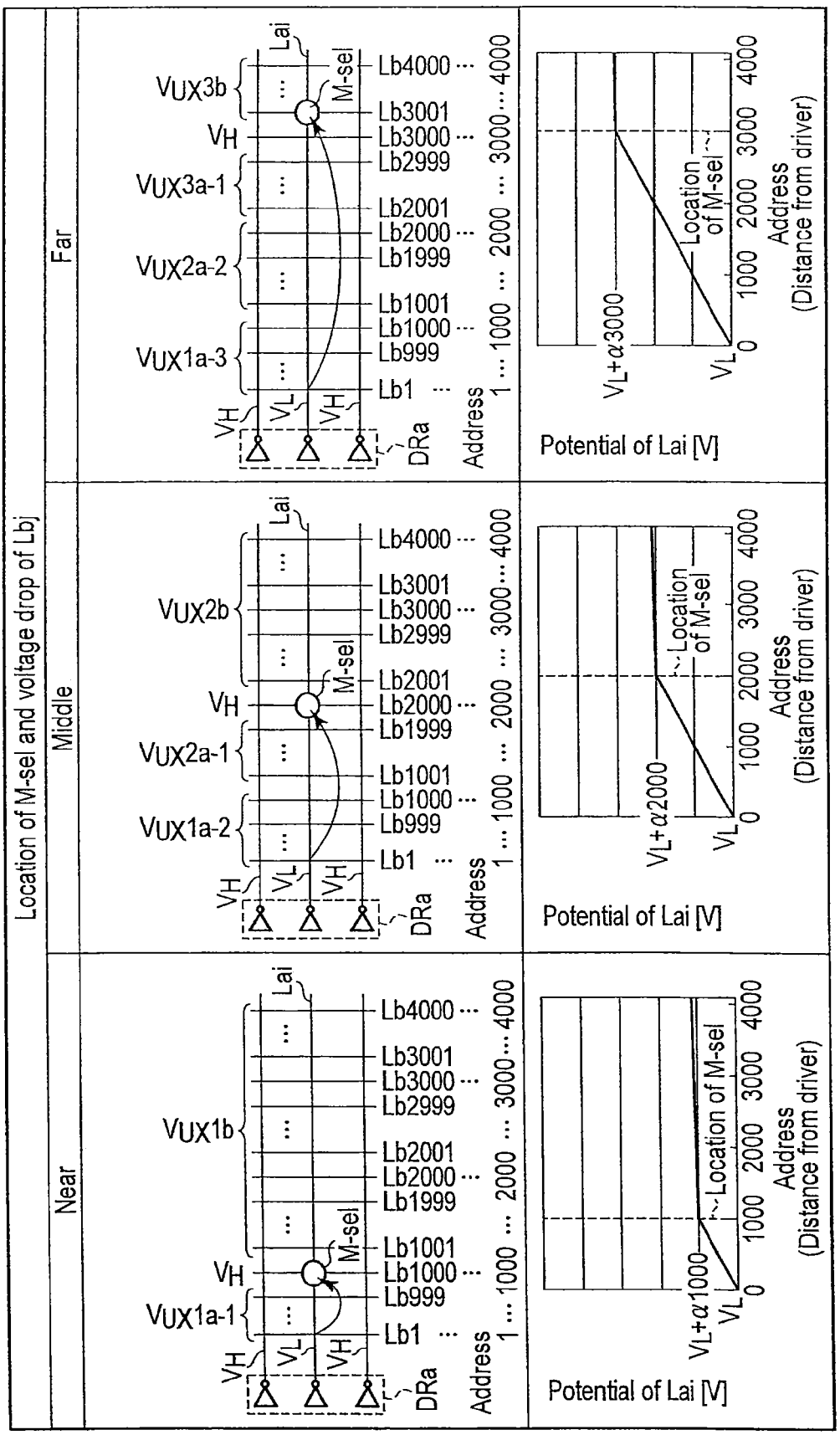
FIG. 27 is an example of a view showing an example of potentials applied to unselected second conducive lines.

FIG. 25 and FIG. 26 show a fourth embodiment that determines potentials in unselected second conductive lines.

The fourth embodiment is a modification of the third embodiment.

As compared with the third embodiment, this example is characterized in how to determine an adjustment value of a potential applied to one end of each of unselected second conductive lines (Near unselected second conductive lines) placed on an inverter (a driver) DRa side of a selected memory cell M-sel. Other points are the same as those in the third embodiment, and hence a detailed description thereof will be omitted.

In this example, a potential (an adjustment value) applied to one end of each of the Near unselected second conductive lines is determined in accordance with each block. That is, although the adjustment values of the potentials applied to ends of the unselected second conductive lines on one side in the same block are the same, the adjustment values of the potentials applied to ends of the unselected second conductive lines on one side in different blocks are different from each other.

For example, when an address of the selected memory cell M-sel is in the range of 1 to 1000, which is an address 1000 (Near) in this example, the address of the selected memory cell M-sel belongs to a first block B1.

In this case, the unselected second conductive lines Lb1, . . . Lb999 placed on the inverter DRa side of the selected memory cell M-sel all belong to the first block B1.

Therefore, the control circuit 17 constantly sets potentials Vb1, . . . Vb999 applied to one end of each of the Near unselected second conductive lines Lb1, . . . Lb999 to a voltage VUX1a (Fixed) irrespective of the address (1 to 1000) of the selected memory cell M-sel.

Additionally, when the address of the selected memory cell M-sel is in the range of 1001 to 2000, which is an address 2000 (Middle) in this example, the address of the selected memory cell M-sel belongs to a second block B2.

In this case, of the Near unselected second conductive lines Lb1, . . . Lb1999, the second conductive lines Lb1, . . . Lb1000 belong to the first block B1, and the second conductive lines Lb1001, . . . Lb1999 belong to the second block B2.

Therefore, the control circuit 17 constantly sets the potentials Vb1, . . . Vb1000 applied to one end of each of the first conductive lines Lb1, . . . Lb1000 in the first block B1 in the Near unselected second conductive lines Lb1, . . . Lb1999 to the voltage VUX1a (Fixed) irrespective of the address (1001 to 2000) of the selected memory cell M-sel.

Further, the control circuit 17 constantly sets the potentials Vb1001, . . . Vb1999 applied to one end of each of the second conductive lines Lb1001, . . . Lb1999 in the second block B2 in the Near unselected second conductive lines Lb1, . . . Lb1999 to a voltage VUX2a (Fixed) irrespective of the address (1001 to 2000) of the selected memory cell M-sel.

Further, the same setting is configured when the address of the selected memory cell M-sel falls within the range of 2001 to 3000 and the range of 3001 to 4000.

Thus, the relationship between the address of the selected memory cell M-sel and the adjustment values of the potentials in the unselected second conductive lines (the DRa side and the opposite side thereof) is collectively shown in FIG. 26. A table shown in FIG. 26 is stored as an LUT in, e.g., a memory portion. It is to be noted that the control circuit 17 sets voltages (adjustment values) of the Far unselected first conductive lines to be equal to those in the third embodiment. Furthermore, the control circuit 17 can set the voltages (the adjustment values) of the Far unselected first conductive lines to be equal to those in the second or first embodiment.

According to the fourth embodiment, since the potential (the adjustment value) applied to one end of each of the unselected second conductive lines is determined in accordance with the position (the address) of the selected second conductive line, i.e., the position (the address) of the selected memory cell M-sel, each leak current (a sneak current) in the cross-point type memory cell array can be suppressed, and a low-consumption current can be attained.

5. COMBINATION OF FIRST AND SECOND TECHNOLOGICAL CONCEPTS

The first and second technological concepts can be combined.

That is, a potential applied to one end of each of unselected first conductive lines and a potential applied to one end of each of unselected second conductive lines can be adjusted in accordance with a position (an address) of a selected memory cell, respectively.

In this case, since each leak current in the cross-point type memory cell array can be more finely controlled in accordance with a position of the selected memory cell, a voltage can be efficiently applied to the selected memory cell, thereby realizing a lower-consumption current.

6. HOW TO DETERMINE ADJUSTMENT VALUE (OFFSET VALUE)

A description will now be given as to how to determine an optimum value of a potential for each of unselected first conductive lines in the first technological concept and how to determine an optimum value of a potential for each of unselected second conductive lines in the second technological concept.

These adjustment values vary depending on characteristics of each memory cell (a resistance change element and a rectifying element), a size of a memory cell array (wiring resistances of the first and second conductive lines), or a parasitic capacitance generated in the first and second conductive lines.

Therefore, when these elements are determined as prerequisites, the optimum values can be normalized, and their adjustment values can be applied to the first to fourth embodiments in the first and second technological concepts.

FIG. 29 shows each optimum value normalized in accordance with a position of a selected memory cell.

An ordinate in FIG. 29 represents a voltage applied to the selected memory cell. Here, a situation where the voltage applied to the selected memory cell becomes the maximum is normalized as 1. An abscissa represents a voltage value of each of unselected first conductive lines (the first technological concept) or each of unselected second conductive lines (the second technological concept). Here, the unselected first conductive lines (the first technological concept) and the unselected second conductive lines (the second technological concept) will be generically referred to as unselected conductive lines.

A dot ♦ indicated as Near corresponds to a case where the selected memory cell is assumed to have an address 1000.

A dot ■ indicated as Middle corresponds to a case where the selected memory cell is assumed to have an address 2000.

A dot ▲ indicated as Far corresponds to a case where the selected memory cell is assumed to have an address 3000.

Here, as shown in FIG. 29, when a voltage of each unselected conductive line is changed, a voltage applied to the selected memory cell varies. Here, each unselected conductive line with which the voltage applied to a selected conductive line becomes the highest is determined to correspond to an adjustment value. In addition, it can be understood that unevenness occurs due to a parasitic capacitance of each unselected conductive line or the like. Therefore, it is preferable to obtain an adjustment value by performing fitting with respect to each plot.

Therefore, like the first embodiment in each of the first and second technological concepts, it is desirable to set a voltage (an adjustment value) in accordance with each unselected first conductive line or each unselected second conductive line.

Furthermore, in case of applying the result shown in FIG. 29 to, e.g., the third embodiment in each of the first and second technological concepts, "VUX1a and VUX1b", "VUX2a and VUX2b", and "VUX3a and VUX3b" in FIG. 13 and FIG. 24 can be determined as follows, respectively.

When a voltage calculated from an average of adjustment values in a situation where a position of a selected memory cell corresponds to Near is determined as VUX-near-ave, both VUX1a and VUX1b in FIG. 13 and FIG. 24 can be set to VUX-near-ave. Moreover, when a voltage calculated from an average of adjustment values in a situation where a position of the selected memory cell corresponds to Middle is determined as VUX-middle-ave, both VUX2a and VUX2b in FIG. 13 and FIG. 24 can be set to VUX-middle-ave. Additionally, when a voltage calculated from an average of adjustment values in a situation where a position of the selected memory cell corresponds to Far is determined is determined as VUX-far-ave, both VUX3a and VUX3b in FIG. 13 and FIG. 24 can be set to VUX-far-ave.

The example of FIG. 29 has a relationship of VUX-near-ave<VUX-middle-ave<VUX-far-ave.

FIG. 30 to FIG. 32 show a relationship between an address of the selected memory cell and each adjustment value. In each of FIG. 30 to FIG. 32, an ordinate represents an adjustment value of a selected conductive line in FIG. 29, and an abscissa represents an address of the selected conductive line.

In the drawings, an address of the selected memory cell means an address of the selected first conductive line in the first technological concept, and it means an address of the selected second conductive line in the second technological concept.

Further, adjustment value means an average of adjustment values of potentials in unselected first conductive lines (the first technological concept) or an average of adjustment values of potentials in unselected second conductive lines (the second technological concept).

For example, in regard to an address 1000, VUX-near-ave explained in FIG. 29 corresponds to a voltage calculated from the adjustment value described herein. In regard to an address 2000, VUX-middle-ave explained in FIG. 29 corresponds to a voltage calculated from the adjustment value described herein. In regard to an address 3000, VUX-far-ave explained in FIG. 29 corresponds to a calculated voltage described herein.

In the example shown in FIG. 30, a relationship between the address and the adjustment value is fitted by using a linear function. In the example shown in FIG. 31, the relationship between the address and the adjustment value is fitted by using a quadratic function. In the example shown in FIG. 32, the relationship between the address and the adjustment value is fitted by using a cubic function.

This adjustment value (an offset value) is acquired by, e.g., a simulation at the time of designing the resistance change memory or a die sort test of a trial product. Furthermore, the relationship between the address and the adjustment value is represented in the form of a table, and it is previously stored in, e.g., the memory portion (e.g., an ROM) 18 in FIG. 6 before product shipment.

In this example, the relationship between the address and the adjustment value is approximated by using an nth-order function, e.g., the linear function, the quadratic function, or the cubic function, but the actually obtained adjustment value itself may be stored in the memory portion like the first embodiment in each of the first and second technological concepts.

Moreover, at the time of an actual operation (a write/read operation), the control circuit reads an adjustment value of a potential applied to one end of each of unselected first or second conductive lines from the memory portion 18 in FIG. 6 based on an address of a selected memory cell. Additionally, the potential generating circuit 15 shown in FIG. 6 is used to actually generate these adjustment values, and each of these adjustment values is applied to one end of each of the unselected first or second conductive lines.

As described above, the adjustment values of the potentials of the unselected first conductive lines in the first technological concept and the adjustment values of the potentials in the unselected second conductive lines in the second technological concept are determined, and the adjustment values are used at the time of an actual operation, thereby achieving low-consumption power at the time of the actual operation.

7. APPLICATION EXAMPLE

The resistance change memory according to each of the first and second technological concepts can be applied to, e.g., a three-dimensional cross-point type resistance change memory.

Figure 33:
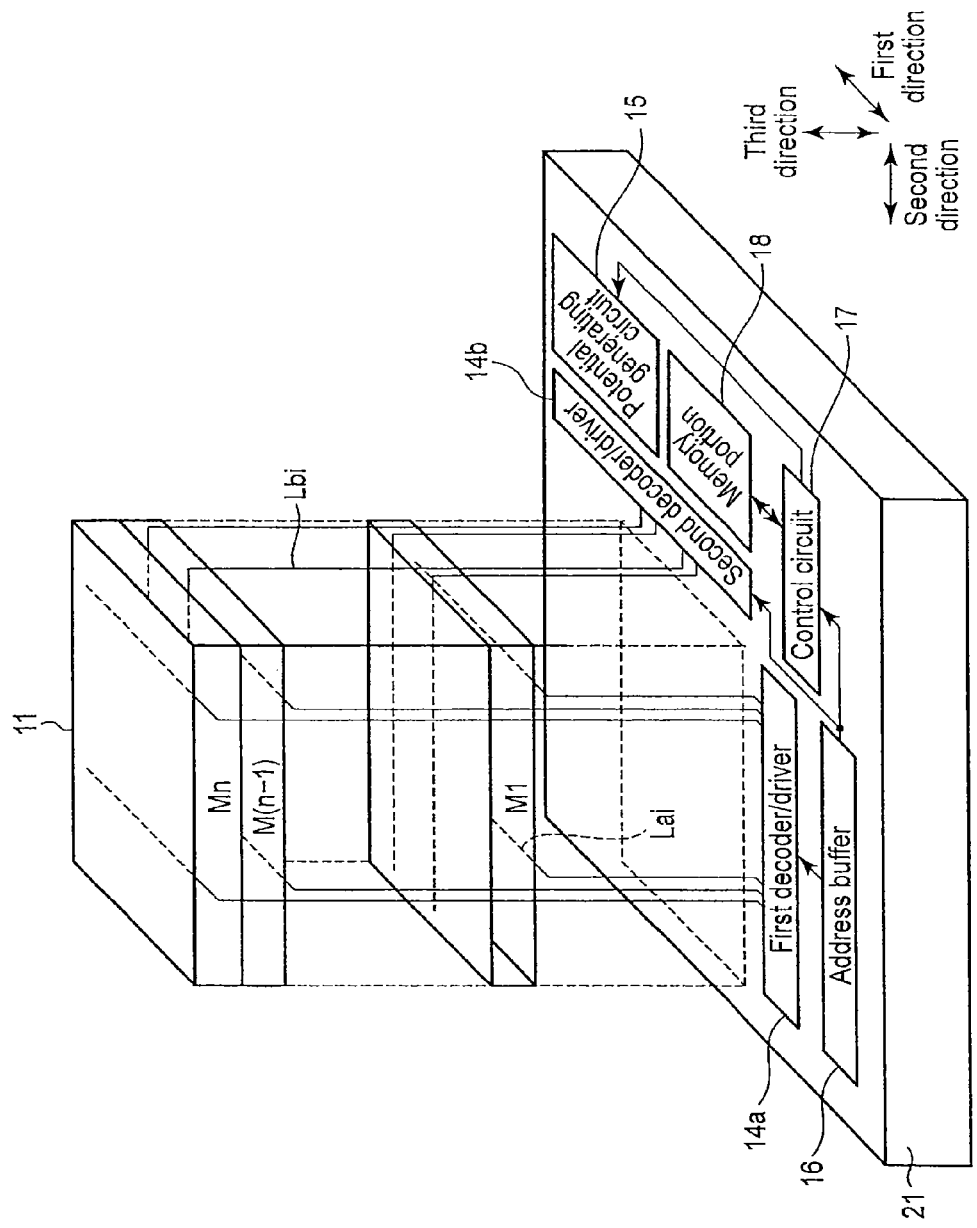
FIG. 33 is an example of a view showing a resistance change memory according to an application example.
Figure 34:
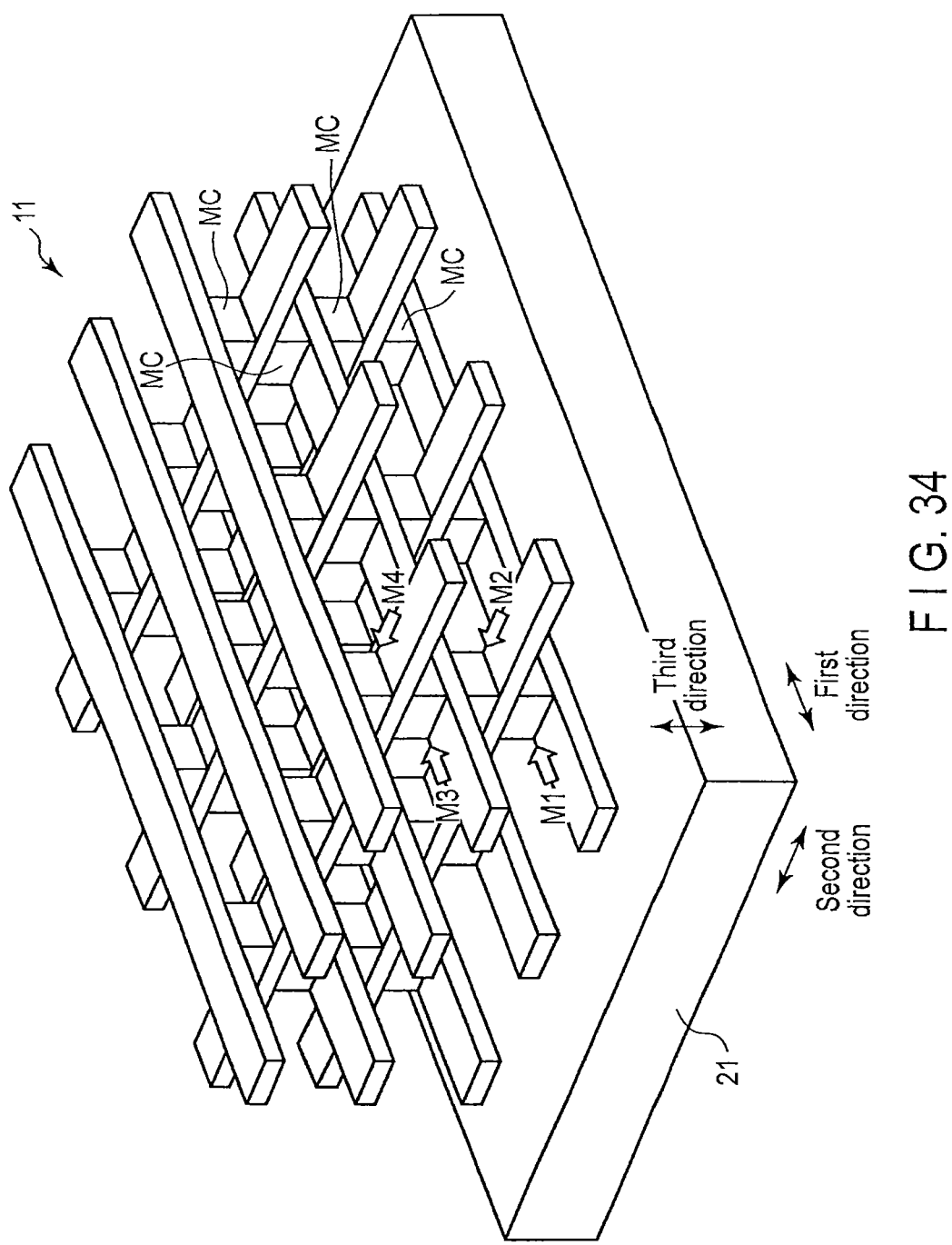
FIG. 34 is am example of a view showing a memory cell array in FIG. 33.

Each of FIG. 33 and FIG. 34 shows a three-dimensional cross-point type resistance change memory.

A memory cell array 11, first and second decoders/drivers 14a and 14b, a potential generating circuit 15, an address buffer 16, a control circuit 17, and a memory portion 18 are arranged on a semiconductor substrate 21, respectively.

The memory cell array 11, the first and second decoders/drivers 14a and 14b, the potential generating circuit 15, the address buffer 16, the control circuit 17, and the memory portion 18 correspond to the elements shown in FIG. 6 and FIG. 18.

The memory cell array 11 has stacked sub-arrays M1, . . . M(n−1), and Mn (n is a natural number which is not smaller than 2). Each of the sub-arrays M1, . . . M(n−1), and Mn has first conductive lines (e.g., word lines) and second conductive lines (e.g., bit lines) that cross each other.

It is to be noted that each sub-array may have the first conductive lines and the second conductive lines, or the two sub-arrays which are adjacent to each other in a third direction (an up-and-down direction) may have either the first conductive lines or the second conductive lines in common.

When the first and second technological concepts are applied to the three-dimensional cross-point type resistance change memory, a memory capacity can be increased, and a sneak current that is produced in the three-dimensional cross-point type can be effectively avoided, thereby avoiding erroneous writing and realizing low-consumption power.

8. CONCLUSION

Thus, according to the embodiments, in the operation mode that a voltage or a current is applied to a selected memory cell, suppressing leak currents flowing through unselected memory cells enables efficiently applying a voltage to a selected memory cell, thereby suppressing a consumption current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a plurality of first conductive lines extending in a first direction, and arranged side by side in a second direction which intersects the first direction;
   a plurality of second conductive lines extending in the second direction, and arranged side by side in the first direction;
   memory cells connected between the first conductive lines and the second conductive lines, at respective intersections of the first conductive lines and the second conductive lines;
   a first driver/decoder connected to first ends of the first conductive lines;
   a second driver/decoder connected to first ends of the second conductive lines;
   a potential generating circuit generating a potential which is applied to the first ends of the first conductive lines and the first ends of the second conductive lines; and
   a control circuit controlling an operation mode which applies a voltage or a current to a selected memory cell among the memory cells,
   wherein each of the memory cells comprises a rectifying element and a resistance change element connected in series, and
   the control circuit is configured, in the operation mode, to:
   apply a first potential to a first end of a selected first conductive line connected to the selected memory cell among the first conductive lines and first ends of unselected second conductive lines not connected to the selected memory cell among the second conductive lines,
   apply a second potential larger than the first potential to a first end of a selected second conductive line connected to the selected memory cell among the second conductive lines,
   apply third potentials smaller than the second potential to first ends of unselected first conductive lines not connected to the selected memory cell among the first conductive lines respectively, and
   change the third potentials to a plurality of values based on an address of the selected first conductive line.

2. The memory of claim 1,
   wherein the third potentials are equal to or higher than a fourth potential of the selected second conductive line at a position where the selected memory cell connected to the selected first conductive line.

3. The memory of claim 1,
   wherein the third potentials applied to the first ends of the unselected first conductive lines placed on a side of the selected memory cell opposite to the second decoder/driver.

4. The memory of claim 3,
   wherein the value of the third potentials applied to the first ends of the unselected first conductive lines placed on a side of the selected memory cell opposite to the second decoder/driver is lowered in accordance with an increment in the address of the selected first conductive line.

5. The memory of claim 3,
   wherein the first conductive lines are divided into blocks, and
   the value of the third potentials applied to the first ends of the unselected first conductive lines placed on a side of the selected memory cell opposite to the second decoder/driver varies in accordance with the block including the selected memory cell.

6. The memory of claim 1,
wherein the third potentials applied to the first ends of the unselected first conductive lines placed on a side of the selected memory cell facing the second decoder/driver have values that differ depending on each of the unselected first conductive lines.

7. The memory of claim 1,
wherein the third potentials applied to the first ends of the unselected first conductive lines placed on a side of the selected memory cell facing the second decoder/driver have the same value.

8. The memory of claim 7,
wherein the first conductive lines are divided into blocks, and
the value of the third potentials applied to the first ends of the unselected first conductive lines placed on a side of the selected memory cell facing the second decoder/driver varies in accordance with the block including the selected memory cell.

9. The memory of claim 1,
wherein the first conductive lines are divided into blocks, and
the third potentials applied to the first ends of the unselected first conductive lines placed on a side of the selected memory cell facing the second decoder/driver have values that differ in accordance with each of the blocks.

10. The memory of claim 1, further comprising:
a memory portion which stores a relationship between the address of the selected memory cell and values of the third potentials applied to the first ends of the unselected first conductive lines,
wherein the control circuit determines the values of the third potentials applied to the first ends of the unselected first conductive lines based on the address of the selected memory cell in the operation mode.

11. A resistance change memory comprising:
a plurality of first conductive lines extending in a first direction, and arranged side by side in a second direction which intersects the first direction;
a plurality of second conductive lines extending in the second direction, and arranged side by side in the first direction;
memory cells connected between the first conductive lines and the second conductive lines at respective intersections of the first conductive lines and the second conductive lines;
a first driver/decoder connected to first ends of the first conductive lines;
a second driver/decoder connected to first ends of the second conductive lines;
a potential generating circuit generating a potential which is applied to the first ends of the first conductive lines and the first ends of the second conductive lines; and
a control circuit controlling an operation mode which applies a voltage or a current to a selected memory cell among the memory cells,
wherein each of the memory cells comprises a rectifying element and a resistance change element connected in series, and
the control circuit is configured, in the operation mode, to:
apply a first potential to a first end of a selected first conductive line connected to the selected memory cell among the first conductive lines,
apply a second potential larger than the first potential to first ends of unselected first conductive lines not connected to the selected memory cell among the first conductive lines and a first end of a selected second conductive line connected to the selected memory cell among the second conductive lines,
apply third potentials larger than the first potential to first ends of unselected second conductive lines not connected to the selected memory cell among the second conductive lines respectively, and
change the third potentials to a plurality of values based on an address of the selected second conductive line.

12. The memory of claim 11,
wherein the third potentials are equal to or higher than a fourth potential of the selected first conductive line at a position where the selected memory cell is connected to the selected first conductive line.

13. The memory of claim 11,
wherein the third potentials applied to the first ends of the unselected second conductive lines placed on a side of the selected memory cell opposite to the first decoder/driver side of the selected memory cell have the same value.

14. The memory of claim 13,
wherein the value of the third potentials applied to the first ends of the unselected second conductive lines placed on a side of the selected memory cell opposite to the first decoder/driver is increased in accordance with an increment in the address of the selected second conductive line.

15. The memory of claim 13,
wherein the second conductive lines are divided into blocks, and
the value of the third potentials applied to the first ends of the unselected second conductive lines placed on a side of the selected memory cell opposite to the first decoder/driver varies in accordance with the block including the selected memory cell.

16. The memory of claim 11,
wherein the third potentials applied to the first ends of the unselected second conductive lines placed on a side of the selected memory cell facing the first decoder/driver have values that differ depending on each of the unselected second conductive lines.

17. The memory of claim 11,
wherein the third potentials applied to the first ends of the unselected second conductive lines placed on a side of the selected memory cell facing the first decoder/driver have the same value.

18. The memory of claim 17,
wherein the second conductive lines are divided into blocks, and
the value of the third potentials applied to the first ends of the unselected second conductive lines placed on a side of the selected memory cell facing the first decoder/driver varies in accordance with the block including the selected memory cell.

19. The memory of claim 11,
wherein the second conductive lines are divided into blocks, and
the third potentials applied to the first ends of the unselected second conductive lines placed on a side of the selected memory cell facing the first decoder/driver have values that differ in accordance with each of the blocks.

20. The memory of claim 11, further comprising:
a memory portion which stores a relationship between the address of the selected memory cell and values of the third potentials applied to the first ends of the unselected second conductive lines, wherein the control circuit determines the values of the third potentials applied to the first ends of the unselected second conductive lines based on the address of the selected memory cell in the operation mode.

21. The memory of claim 1, further comprising:

a memory portion which stores a table showing a relationship between the address of the selected memory cell and the values of the third potentials applied to the first ends of the unselected first conductive lines, wherein the control circuit determines the values of the third potentials applied to the first ends of the unselected first conductive lines based on the address of the selected memory cell and the table in the operation mode.

22. The memory of claim 1, wherein the values of the third potentials applied to the first ends of the unselected first conductive lines are determined based on an nth-order function (n is a natural number) by fitting a relationship between the address of the selected memory cell and adjustment values of the third potentials applied to the first ends of the unselected first conductive lines with respect to the nth-order function.

23. The memory of claim 1, wherein second ends on an opposite side of the first ends of the first conductive lines and second ends on an opposite side of the first ends of the second conductive lines are opened (an opened state).

24. The memory of claim 1, wherein the operation mode is a mode that one of a write operation and a read operation of data relative to the selected memory cell is performed.

25. The memory of claim 1, further comprising:

a semiconductor substrate; and memory cell arrays stacked on the semiconductor substrate, wherein each of the memory cell arrays comprises the first conductive lines, the second conductive lines, and the memory cells, and the first driver/decoder, the second driver/decoder, the potential generating circuit, and the control circuit are arranged on the semiconductor substrate.

26. The memory of claim 11, further comprising:

a memory portion which stores a table showing a relationship between the address of the selected memory cell and the values of the third potentials applied to the first ends of the unselected second conductive lines, wherein the control circuit determines the values of the third potentials applied to the first ends of the unselected second conductive lines based on the address of the selected memory cell and the table in the operation mode.

27. The memory of claim 11, wherein the values of the third potentials applied to the first ends of the unselected second conductive lines are determined based on an nth-order function (n is a natural number) by fitting a relationship between the address of the selected memory cell and adjustment values of the third potentials applied to the first ends of the unselected second conductive lines with respect to the nth-order function.

28. The memory of claim 11, wherein second ends on the opposite side of the first ends of the first conductive lines and second ends on the opposite side of the first ends of the second conductive lines are opened (an opened state).

29. The memory of claim 11, wherein the operation mode is a mode that one of a write operation and a read operation of data relative to the selected memory cell is performed.

30. The memory of claim 11, further comprising:

a semiconductor substrate; and memory cell arrays stacked on the semiconductor substrate, wherein each of the memory cell arrays comprises the first conductive lines, the second conductive lines, and the memory cells, and the first driver/decoder, the second driver/decoder, the potential generating circuit, and the control circuit are arranged on the semiconductor substrate.

* * * * *